United States Patent
Xian et al.

(10) Patent No.: US 11,821,947 B1
(45) Date of Patent: Nov. 21, 2023

(54) MULTIPLEXER FOR SDFQ HAVING DIFFERENTLY-SIZED SCAN AND DATA TRANSISTORS, SEMICONDUCTOR DEVICE INCLUDING SAME AND METHODS OF MANUFACTURING SAME

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Huaixin Xian, Hsinchu (TW); Changlin Huang, Hsinchu (TW); Qingchao Meng, Hsinchu (TW); Jerry Chang Jui Kao, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (TW)

( * ) Notice: Subject to any disclaimer, the term of this patent is extended or adjusted under 35 U.S.C. 154(b) by 0 days.

(21) Appl. No.: 17/844,376

(22) Filed: Jun. 20, 2022

(30) Foreign Application Priority Data

Jun. 15, 2022 (CN) .......................... 202210671723.9

(51) Int. Cl.
*G06F 7/50* (2006.01)
*G01R 31/3185* (2006.01)
*H03K 3/353* (2006.01)
*G06F 30/392* (2020.01)

(52) U.S. Cl.
CPC ................ *G01R 31/318541* (2013.01); *G01R 31/31858* (2013.01); *G01R 31/318525* (2013.01); *G01R 31/318555* (2013.01); *G06F 30/392* (2020.01); *H03K 3/353* (2013.01)

(58) Field of Classification Search
USPC .......................................... 716/110, 118, 119
See application file for complete search history.

(56) References Cited

U.S. PATENT DOCUMENTS

| | | | |
|---|---|---|---|
| 8,669,778 B1 * | 3/2014 | Or-Bach | H03K 19/17748 716/104 |
| 9,543,958 B1 * | 1/2017 | Wang | H03K 19/17724 |
| 9,786,361 B1 * | 10/2017 | Wang | H03K 19/1737 |
| 2012/0173938 A1 * | 7/2012 | Chakravarty | G01R 31/318541 714/E11.155 |
| 2016/0261272 A1 * | 9/2016 | Ikeda | H03K 19/17758 |
| 2020/0395938 A1 * | 12/2020 | Liu | H01L 27/0207 |
| 2023/0005556 A1 * | 1/2023 | Sahu | G11C 7/1096 |

* cited by examiner

*Primary Examiner* — Brian Ngo
(74) *Attorney, Agent, or Firm* — Hauptman Ham, LLP

(57) ABSTRACT

A semiconductor device has a cell region including active regions that extend in a first direction and in which are formed components of transistors. The transistors of the cell region are arranged to function as a scan insertion D flip flop (SDFQ). The SDFQ includes a multiplexer serially connected at an internal node to a D flip-flop (FF). The transistors of the multiplexer include data transistors for selecting a data input signal, the data transistors having a first channel configuration with a first channel size, and scan transistors of the multiplexer for selecting a scan input signal, the scan transistors having a second channel configuration with a second channel size. The second channel size is smaller than the first channel size.

20 Claims, 18 Drawing Sheets

US 11,821,947 B1

MULTIPLEXER FOR SDFQ HAVING DIFFERENTLY-SIZED SCAN AND DATA TRANSISTORS, SEMICONDUCTOR DEVICE INCLUDING SAME AND METHODS OF MANUFACTURING SAME

BACKGROUND

The integrated circuit (IC) industry produces a variety of analog and digital semiconductor devices to address issues in different areas. Developments in semiconductor process technology nodes have progressively reduced component sizes and tightened spacing resulting in progressively increased transistor density. ICs progressively become smaller.

Flip-flops (latches) are used as data storage elements. In some circumstances, a flip-flop stores a single bit (binary digit) of data. In some circumstances, a flip-flop (latch) is used for storage of a state and represents a basic storage element of sequential logic in electronics, e.g., shift registers.

One type of flip-flop is a delay (D) flip-flop (FF). A D FF is a digital electronic circuit that delays the change of state of its output signal (Q) until the next rising or falling edge of a clock timing input signal occurs. The D FF is a modified Set-Reset flip-flop with the addition of an inverter to prevent the S and R inputs from being at the same logic level.

A type of D FF is a scan D FF (SDFQ) which is used, e.g., to implement design for testing (DFT). An SDFQ is a D flip-flop that includes a multiplexer to controllably select between an input D during normal operation and a scan input during scan/test operation. Scan flip-flops, e.g., SDFQs, are used for device testing.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
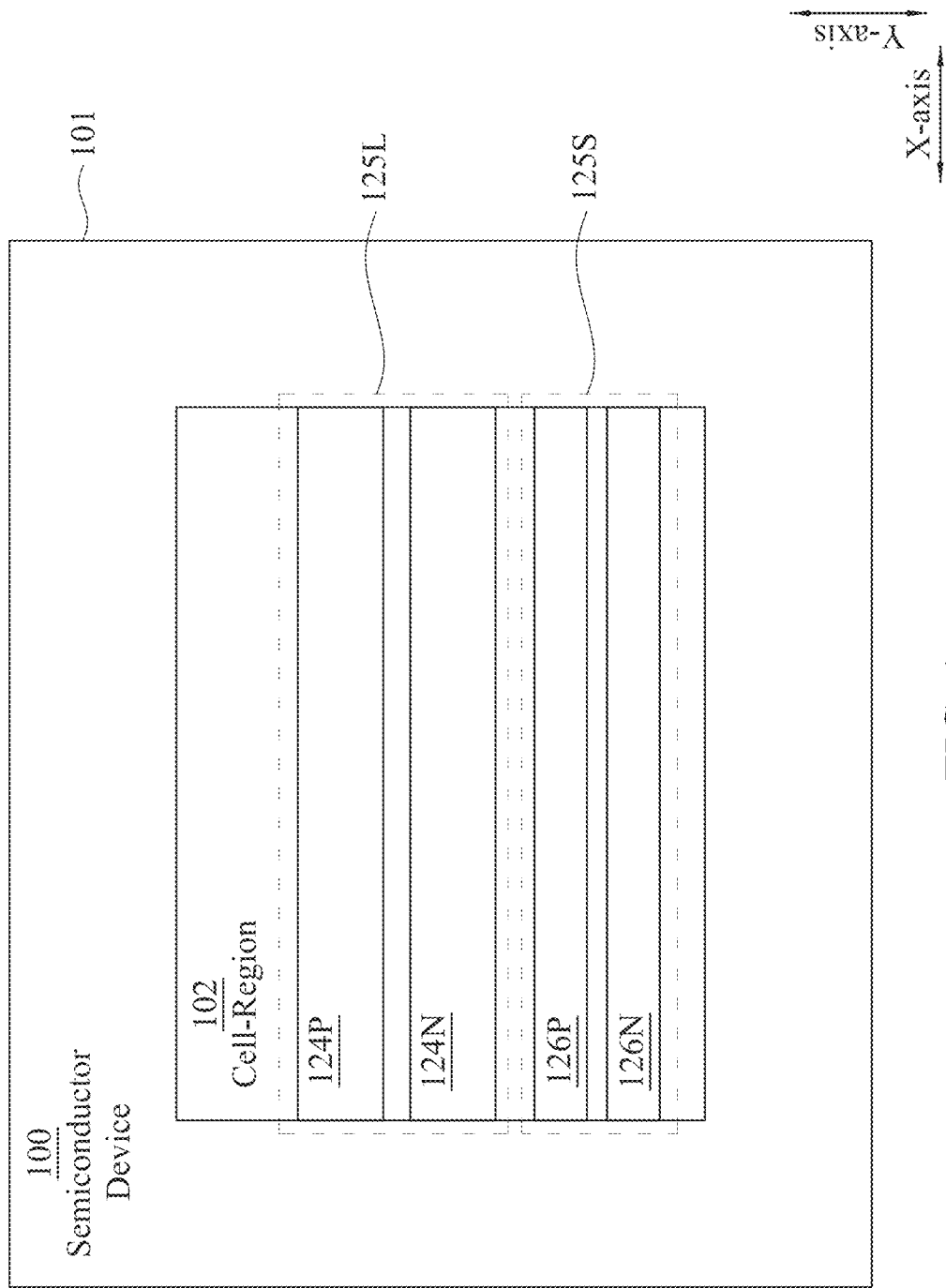
FIG. 1 is a block diagram of semiconductor device, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly.

In some embodiments, the term standard cell structure refers to a standardized building block included in a library of various standard cell structures. In some embodiments, various standard cell structures are selected from a library thereof and are used as components in a layout diagram representing a circuit.

In some embodiments, transistors of a scan group in a multiplexer of an SDFQ are configured to have two sizes, namely a smaller channel size for transistors in a scan group and a larger size for transistors in a data group. In terms of signal propagation delay, the scan group creates a choke (discussed below) as compared to the data group which is discriminating in the effect upon operation of the multiplexer. In particular, the smaller channel size of the sized transistors in the scan group creates a choke which achieves relatively slower signal propagation through the scan group during scan/test operation as compared to signal propagation through the data group during non-scan/test operation, and thus avoids a race condition (discussed below).

In some embodiments, a semiconductor device includes a cell region including active regions (ARs) that extend in a first direction (e.g., parallel to the X-axis) and have components of corresponding transistors formed therein. A first subregion of the cell region includes a first active region in which are formed components of first positive-channel metal oxide semiconductor (PMOS) transistors and a second active region in which are formed components of first negative-channel metal oxide semiconductor (NMOS) transistors. Transistors having components of each of the first and second active regions have a first channel configuration with a first channel size. A second subregion in the cell region includes a third active region in which are formed components of second PMOS transistors and a fourth active region in which are formed components of second NMOS transistors. Transistors based in each of the third active regions and the fourth active regions have a second channel configuration with a second channel size. The second channel size is smaller than the first channel size.

The transistors of the cell region are arranged to function as an active circuit, e.g., a scan insertion D flip-flop (SDFQ). The SDFQ includes a multiplexer and a D flip-flop. In some embodiments, the SDFQ is connected to combinational logic. During normal operation, i.e., during non-scan/test operation, the multiplexer selects a data input signal that is generated by the combinational logic. During scan/test operation, however, the multiplexer selects a scan input signal. The multiplexer includes transistors arranged in a data group that select the data input signal and transistors arranged in a scan group that select the scan input signal. The transistors in the data group have components formed in the first and second active regions and so have the first channel configuration, i.e., have the larger channel size. The transistors in the scan group have components formed in the third and fourth active regions and so have the second channel configuration, i.e., have the smaller channel size. As a result, the signal propagation delay of the transistors in the scan group is increased when compared to the signal propagation delay of the transistors in the data group. In terms of when a signal reaches an internal node common to the transistors of the scan group and the data group, the increase in the propagation delay of the transistors in the scan group during test/scan operation emulates the propagation delay of the combinational logic plus the propagation delay of the transistors in the data group during non-test/scan operation, which avoids a race condition (discussed below).

In some embodiments, configuring the transistors of the scan group to have the smaller channel size is referred to as configuring the scan group to be a choke (discussed below). According to another approach (discussed below), a counterpart SDFQ includes a counterpart multiplexer, the counterpart multiplexer including transistors that would be counterparts of the transistors in the scan group (counterpart scan transistors), transistors that would be counterparts of the transistors in the data group (counterpart data transistors), and transistors that would be counterparts of the transistors in the delay group (counterpart delay transistors). According to the other approach, all of the counterpart scan transistors and all of the counterpart data transistors are configured to have a larger channel size whereas all of the counterpart delay transistors are configured to have a smaller channel size, i.e., to be a choke. As such, the other approach creates a choke that indiscriminately affects operation of the multiplexer during both scan/test operation and during non-scan/test operation, and thus the other approach fails to avoid the race condition (discussed below). By contrast, configuring the transistors of the scan group to have the smaller channel size as in some embodiments of the present application creates a choke which is discriminating in the effect upon operation of the multiplexer, i.e., creates a choke which achieves relatively slower signal propagation through the scan group during scan/test operation as compared to signal propagation through the data group during non-scan/test operation, and thus avoids the race condition.

Relevant terminology includes the following. When data input to a sequential logic circuit, e.g., an SDFQ, changes state, propagation delay refers to a finite amount of time needed by the logic gates to perform the operations on changed input data. A condition of valid operation is that the interval between clock pulses must be long enough so that all the logic gates have time to respond to the changes in the input data and have their corresponding outputs settle to stable logic values before the next clock pulse occurs. In general, when the condition is met, the circuit is stable and reliable.

Setup time is the minimum time that a signal must be stable before the clock rising edge. When the setup time is too brief, there is a risk that a logical state of the signal will be misinterpreted. More particularly, when the setup time is too brief, there is a risk that the signal will not settle into a first range of voltages which clearly represents a logical zero or a third range of voltages which clearly represents a logical one, but instead will remain in an intermediate second range of voltages which does not clearly represent either a logical zero or a logical one, resulting in the possibility of an incorrect interpretation of the logical state of the signal will be entered into a register, i.e., latched. Setup-slack is the difference in time between when the signal becomes valid and the setup time. In other words, when the setup-slack is positive, then the signal becomes valid sooner than required by the setup time. A setup-slack violation is a type of violation in which the setup-slack is negative such that the signal becomes valid after the point in time required by the setup time. In general, though a large positive setup-slack avoids signal-state misinterpretation, nevertheless a large positive setup-slack is undesirable because a significant portion of the large positive setup-slack represents delay that could be avoided. Accordingly, in general, the setup-slack is targeted for a near zero, positive number.

Hold time is the shortest time that a signal must be stable after the clock rising edge. When the hold time is not met, there is a risk that an incorrect interpretation of the logical state of the signal will be entered into a register, i.e., latched. Hold-slack is the difference in time between when the signal becomes valid and the hold time. In other words, when hold-slack is positive, then the signal remains valid longer than required by the hold time. A hold-slack violation is a type of slack violation in which the hold-slack is negative such that the signal remains valid too briefly, i.e., the signal remains valid for a shorter amount of time than is required by hold time. In general, though a large positive hold-slack avoids signal-state misinterpretation, nevertheless a large positive hold-slack is undesirable because a significant portion of the large positive hold-slack represents delay that could be avoided. Accordingly, in general, the hold-slack is targeted for a near zero, positive number.

FIG. 1 is a block diagram of semiconductor device 100, in accordance with some embodiments.

Semiconductor device 100 is includes a semiconductor substrate 101 and active regions (ARs) 124P, 124N, 126P, 126N. Semiconductor device 100 further includes a cell region 102. Cell region 102 includes active regions (ARs) 124P, 124N, 126P, 126N that extend in a first direction, e.g., parallel to the X-axis. In FIG. 1, cell region 102 includes two subregions 125L and 125S. Within cell region 102, subregions 125L, 125S are aligned with respect to the X-axis but are displaced relative to a second direction (e.g., parallel to the Y-axis) perpendicular to the first direction. Components of transistors, e.g., source/drain (S/D) regions and corresponding channels, or the like, are formed correspondingly in ARs 124P, 124N, 126P, 126N.

AR 124P in subregion 125L is doped with a first conductivity-type dopant such that the transistors corresponding to AR 124P are field-effect transistors (FETs), and more particularly, positive-channel metal oxide semiconductor (PMOS) FETs (PFETs). The transistors corresponding to AR 124P have a first channel configuration. In some embodiments, transistors corresponding to AR 124P are planar transistors and the first channel configuration is defined by a first height relative to the Y-axis. In some embodiments, transistors corresponding to AR 124P are fin-type field effect transistors (fin-FETs) and the first channel configuration is defined by a first number of fins, where the first number is X and X is a positive integer. In some fin-FET embodiments, a maximum height of AR 124P or any AR, is proportional to a maximum number fins. In either case, the transistors in AR 124P have a first channel configuration of a first channel size.

AR 124N in subregion 125L is doped with a second conductivity-type dopant such that the transistors corresponding to AR 124N are negative-channel metal oxide semiconductor (NMOS) FETs (NFETs). The transistors corresponding to AR 124N also have the first channel configuration. In some embodiments, transistors corresponding to AR 124N are planar transistors and the first channel configuration is defined by the first height. In some embodiments, transistors corresponding to AR 124N are fin-FETs and the first channel configuration is defined by the number X of fins. In either case, the transistors in AR 124N have the first channel configuration of the first channel size.

AR 126P in subregion 125S is doped with the first conductivity-type dopant such that the transistors corresponding to AR 126P are PMOS transistors. The transistors corresponding to AR 126P have a second channel configuration. In some embodiments, transistors corresponding to AR 126P are planar transistors and the second channel configuration is defined by a second height, wherein the second height is less than the first height. In some embodiments, transistors corresponding to AR 126P are fin-FETs and the second channel configuration is defined by a second number of fins, where the second number is Y, Y is a positive integer, and Y<X. In either case, the transistors in AR 126P have a second channel configuration of a second channel size. The second channel size is smaller than the first channel size.

AR 126N in subregion 125S is doped with the second conductivity-type dopant such that the transistors corresponding to AR 126N are NMOS transistors. The transistors corresponding to AR 126N also have the second channel configuration. In some embodiments, transistors corresponding to AR 126N are planar transistors and the second channel configuration is defined by the second height. In some embodiments, transistors corresponding to AR 126N are fin-FETs and the second channel configuration is defined by the number Y of fins. In either case, the transistors of AR 126N have the second channel configuration of the second channel size.

In FIG. 1, relative to the Y-axis, the size of ARs 124P and 124N included in subregion 125L are larger than the sizes of ARs 126P and 126N included in subregion 125S. Accordingly, in some embodiments and relative to the Y-axis, the suffix uppercase letter L in the reference number 125L indicates relatively larger/taller ARs whereas the suffix uppercase letter S in reference number 125S indicates relatively smaller/shorter ARs.

The transistors formed with ARs 126P, 126N have a smaller channel size and therefore a greater propagation delay. This allows scan transistors in a multiplexer to emulate the propagation delay of combinational logic, as explained in further detail below.

Figure 2A:
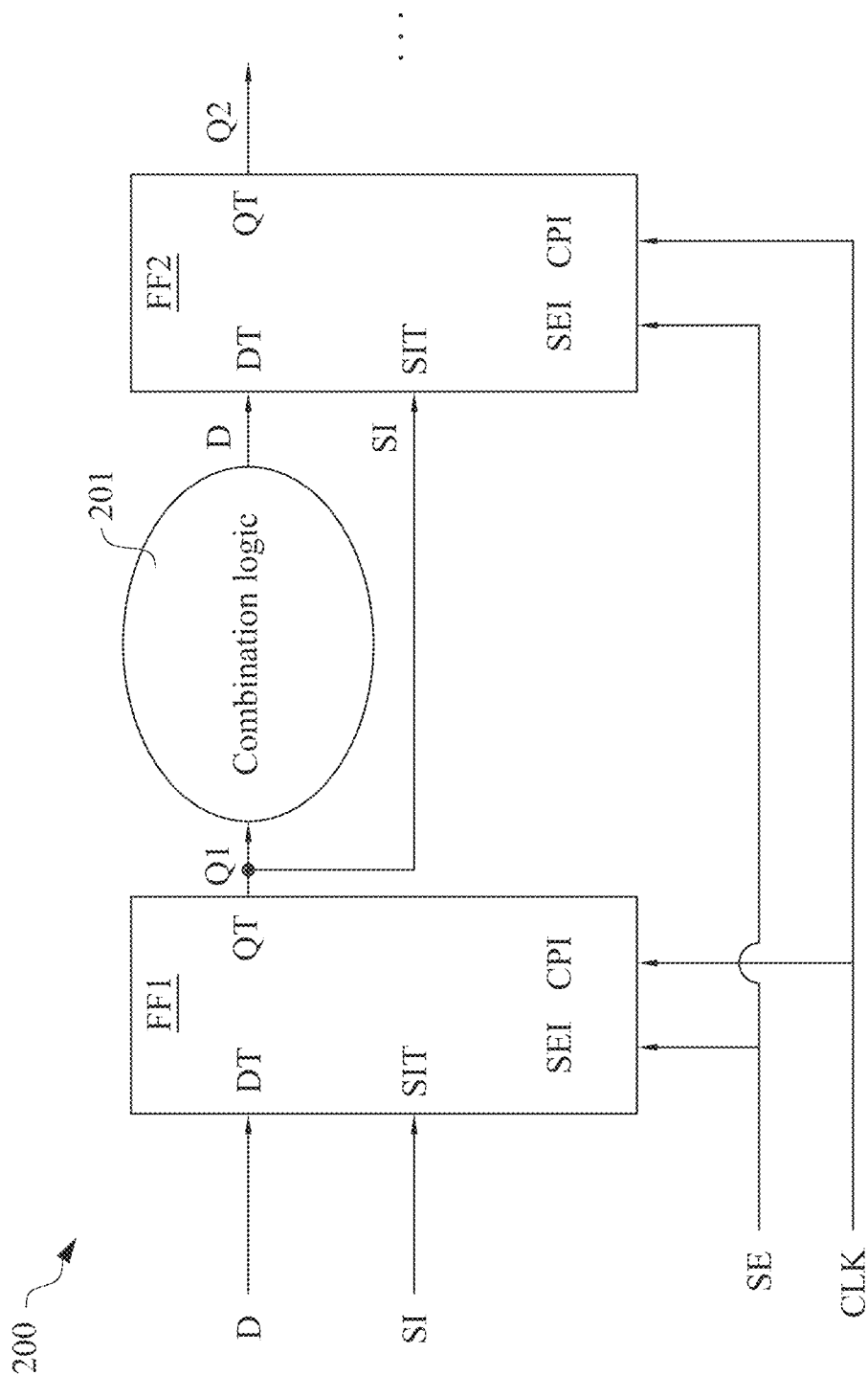
FIG. 2A is a block diagram of a semiconductor device, in accordance with some embodiments.

FIG. 2A is a block diagram of a semiconductor device 200, in accordance with some embodiments.

Semiconductor device 200 includes a flip-flop FF1 and a flip-flop FF2. Each of flip-flops FF1, FF2 is a scan insertion D flip-flop (SDFQ). Each of flip-flops FF1, FF2 includes a data terminal DT, and a scan input terminal SIT and an output signal terminal QT. Each of flip-flops FF1, FF2 also includes a sense enable terminal SEI and a clock terminal CPI. Data input signals D1 and D2 are received correspondingly by flip-flops FF1, FF2 at data terminal DT. A scan input signal SI is received by each of flip-flops FF1, FF2 at scan input terminal SIT. A scan enable signal SE is received by each of flip-flops FF1, FF2 at scan enable terminal SEI. A clock signal CLK is received by each of the flip-flops FF1, FF2 at clock terminal CPI. Output signals Q1 and Q2 are generated correspondingly by flip-flops FF1, FF2 at output signal terminal QT.

The operation of flip-flops FF1, FF2 is coordinated by clock signal CLK. During normal, i.e., non-scan/test, operation, the scan enable signal SE is in a deactivated state so that scan input signal SI is not selected but rather data signal D is selected by flip-flops FF1, FF2. During an oscillation of clock signal CLK (assuming proper functioning of FF1), the bit value of data input signal D1 at data terminal DT of flip-flop FF1 is transferred from data terminal DT of flip-flop FF1 to output terminal QT of flip-flop FF1 as the bit value of output signal Q1. Also, output signal Q1 of flip-flop FF1 is received by combinational logic 201 as an input. Assuming proper functioning of combination logic 201, the output of combination logic 201 is received by FF2 as data input signal D2 at data terminal DT of flip-flop FF2. By the end of the clock cycle (assuming proper functioning of FF2), output signal Q2 at output terminal QT of flip-flop FF2 corresponds to the output of combinational logic 201.

However, during scan/test operation, scan enable signal SE is in an activated state so that scan input signal SI is selected and data signals D1 and D2 are ignored by corresponding flip-flops, FF1, FF2. During an oscillation of clock signal CLK (assuming proper functioning of FF1), the bit value of scan input signal SI at scan input terminal SIT of flip-flop FF1 is transferred from scan input terminal SIT of flip-flop FF1 to output terminal QT of flip-flop FF1 as the bit value of output signal Q1. Also, output signal Q1 of flip-flop FF1 bypasses combinational logic 201 and is directly input into scan input terminal SIT of flip-flop FF2. By the end of the clock cycle (assuming proper functioning of FF2), output signal Q2 of flip-flop FF2 corresponds to scan input signal SI directly input from output terminal QT of flip-flop FF1.

In FIG. 2A, if not taken into consideration, the bypassing of combinational logic 201 during scan/test operation otherwise is susceptible to a race condition (or race hazard) with respect to scan input signal SI of flip-flop FF2. More particularly, the synchronization of the bit values through flip-flops FF1, FF2 is configured based on a propagation delay of combinational logic 201. Because combinational logic 201 is bypassed during scan/test operation, there is a risk that the bit value of scan input signal SI reaches an internal node in flip-flop FF2 too soon, i.e., is not held for a sufficient amount of time which represents a hold-time violation. To avoid the race condition, components within flip-flop FF2 are configured to emulate the propagation delay otherwise introduced by combinational logic 201 during scan/test operation. SQFQ embodiments SDFQ disclosed herein are formed in a cell region, such as the cell region 102 shown in FIG. 1, are configured to avoid the hold-time violation during scan/test operation (as discussed below).

Figure 2B:
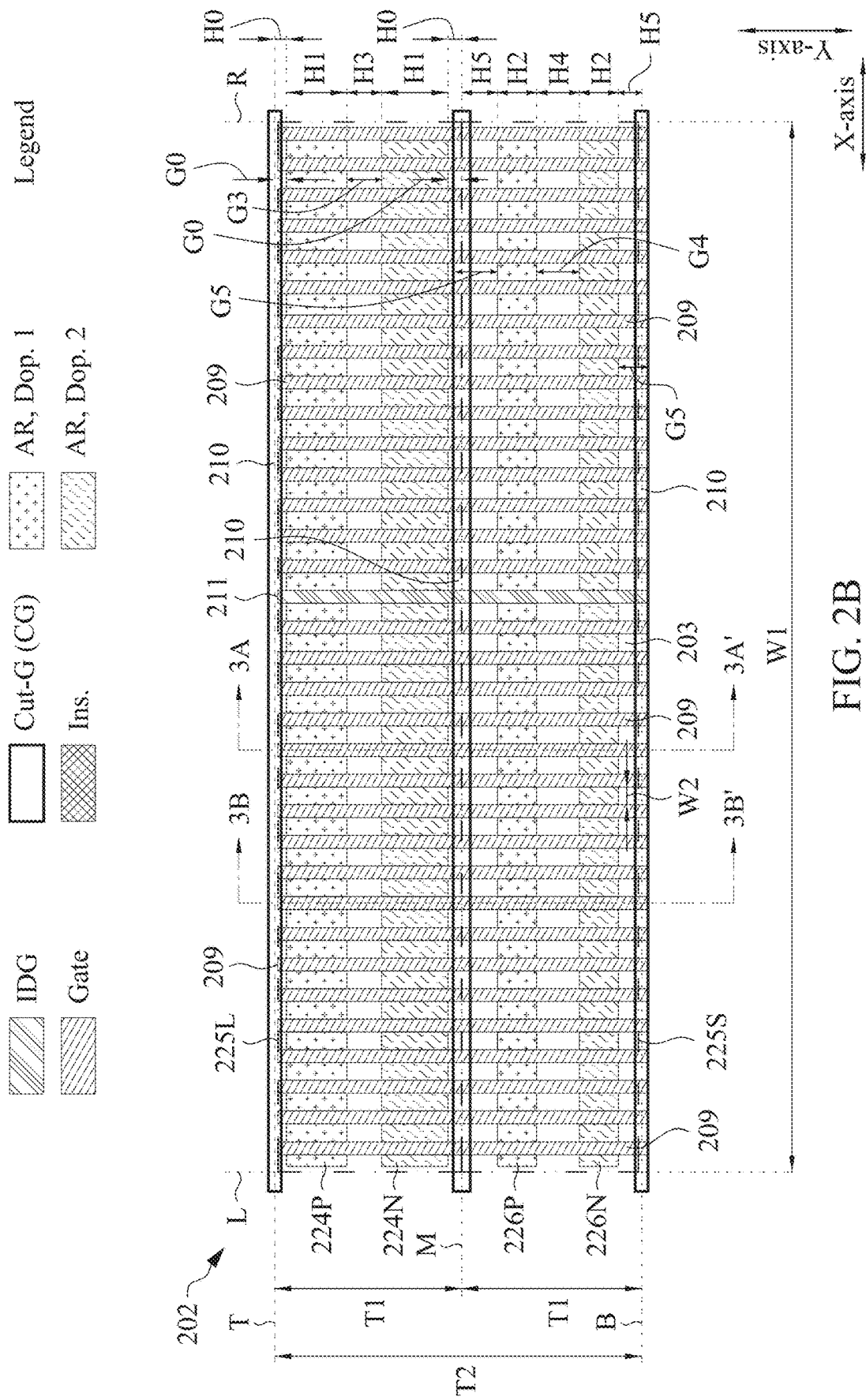
FIG. 2B is layout diagram of a cell region, in accordance with some embodiments.

FIG. 2B is a layout diagram of a cell region 202, in accordance with some embodiments.

Cell region 202 is formed as part of a semiconductor substrate 203. Semiconductor substrate 203 is an example of semiconductor substrate 101 in FIG. 1. In some embodiments, cell region 202 of FIG. 2B is an example of cell region 102 of semiconductor device 100. Section lines 3A-3A' and 3B-3B' relate cell region 202 to the cross-sections of corresponding FIGS. 3A-3B (discussed below).

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., position relative to the Z-axis, of shapes and thus layers by superimposing a second shape on a first shape so that the second shape at least partially overlaps the first shape. For simplicity of discussion, i.e., as a discussion-expedient, some elements in the layout diagram of FIG. 2B are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. FIG. 2B is an example of a layout diagram in which selected layers have been omitted, as discussed below.

In FIG. 2B, cell region 202 includes ARs 224P, 224N, 226P, 226N. ARs 224P, 224N, 226P, 226N are rectangular and have corresponding long axes that extend in the first direction, e.g., parallel to the X-axis. Corresponding short axes of ARs 224P, 224N, 226P, 226N extend in the second direction, e.g., parallel to the Y-axis. AR 224P corresponds with AR 124P in FIG. 1. AR 224N corresponds with AR 124N in FIG. 1. AR 226P corresponds with AR 126P in FIG. 1. AR 226N corresponds with AR 126N in FIG. 1.

In FIG. 2B, relative to the Y-axis, a distance or size is alternately referred to as a height. A perimeter enclosing ARs 224P, 224N, 226P, 226N is rectangular; hence, cell region 202 is rectangular. Relative to the Y-axis, a height of cell region 202 is T2 (discussed below). Relative to the X-axis, a width of cell region 202 is W1 (discussed below).

Cell region 202 is separated into two subregions 225L, 225S. Subregion 225L corresponds with subregion 125L in FIG. 1. Subregion 225S corresponds with subregion 125S in FIG. 1. Subregion 225L and subregion 225S are aligned with respect to the X-axis but are displaced with respect to the Y-axis. Subregion 225L and subregion 225S are adjacent and abut one another along line M, which is parallel to the X-axis. In FIG. 2B, a line M is the midline of cell region 202 with respect to the Y-axis. In FIG. 2B, each of subregion 225L and subregion 225S has a height of T1. In some embodiments, line M is not the midline, and subregions 225L and 225S have different heights. Both subregion 225L and subregion 225S have a width of W1. Each of ARs 224P, 224N has a height of H1. Each of ARs 226P, 226N has a height of H2, where H1>H2. Heights H1 and H2 are determined by design rules of the corresponding semiconductor process technology node.

The boundaries of cell region 202 are defined by lines, a line L (i.e., left boundary L that is parallel to the Y-axis), a line R (i.e., right boundary R that is parallel to the Y-axis), a line T (i.e., top boundary T that is parallel to the X-axis), and a line B (i.e., bottom boundary B that is parallel to the X-axis). The boundaries of subregion 225L are defined by the top boundary T and the midline M with respect to the Y-axis and the left boundary L and the right boundary R with respect to the X-axis. The boundaries of subregion 225S are defined by the midline M and the bottom boundary B with respect to the Y-axis and the left bound L and the right boundary R with respect to the X-axis. The left edge of each of ARs 224P, 224N, 226P, 226N are aligned and are colinear with the left boundary L. The right edge of each of ARs 224P, 224N, 226P, 226N are aligned and are colinear with the right boundary R.

In FIG. 2B, relative to the Y-axis, ARs 224P, 224N are spaced apart with a corresponding gap. In particular, a height of subregion 225L includes: a gap G0 between the top boundary T and the top edge of AR 224P, where gap G0 has a height H0; AR 224P which has a height of H1; a gap G3 between a bottom edge of AR 224P and the top edge of AR 224N, where gap G3 has a height H3; AR 224N which has a height of H1, and a gap G0' between the bottom edge of AR 224N and the midline M, where gap G0' has a height of H0. In FIG. 2B, the height of subregion 225L is 2H0+2H1+H3=T1.

In FIG. 2B, relative to the Y-axis, ARs 226P, 226N are spaced apart with a corresponding gap. In particular, a height of subregion 225S includes: a gap G5 between the midline M and the top edge of AR 226P, where gap G5 has a height of H5; AR 226P which has a height of H2; a gap G4 between a bottom edge of AR 226P and the top edge of AR 226N, where gap G4 has a height of H4; AR 226N which has a height of H2; and a gap G5' between the bottom edge of AR 226N and the bottom boundary B, where gap G5' has a height of H5. In FIG. 2B, the height of subregion 225S is 2H5+2H1+H4=T1.

In FIG. 2B, each of heights of ARs 224P, 224N, 226P, 226N, and each of the gaps G0, G0', G3, G5, G5', G4 adjacent to ARs 224P, 224N, 226P, 226N are determined according to design rules of the corresponding semiconductor process technology node. In some embodiments, other heights (whether symmetric or asymmetric) are used in subregions 225L, 225S.

In some embodiments, conductors (not explicitly shown) that have long axis that extend parallel to the X-axis are positioned in gaps G0, G0', G3, G5, G5', G4. Conductors are configured to receive reference voltages, such as VDD (e.g., power source voltage), VSS (e.g., ground). With regards to a conductor positioned in gaps G0' or G5 that has a long axis parallel to the X-axis and a short axis parallel to the Y-axis, in some embodiments, midline of the short axis of such a conductor is aligned with the midline M. In some embodiments, the midline of the short axis of such a conductor is not aligned with the midline M so that a greater portion of the conductor is in subregion 225S than in 225L or vice versa.

In FIG. 2B, cell region 202 is arranged into two rows that extend parallel to the X-axis, each row having a height T1. Height T2 of cell region 202 is T2=2*T1. In some embodiments, a minimal height of a single-height cell (not shown) is T1. Accordingly, in such embodiments, cell region 202 is referred to as a double height cell because height T2 is double the height of a single-height cell.

In FIG. 2B, cell region 202 further includes gates 209 (not all of which are labeled for simplicity of illustration). Long axes of gates 209 extend parallel the Y-axis. Components of transistors, e.g., source/drain (S/D) regions and corresponding channels, or the like, are formed correspondingly in ARs 224P, 224N, 226P, 226N. Additional components of the transistors of cell region 202 include corresponding portions of gates 209. In some embodiments, a given S/D region is formed by doping a given portion of an AR 224P, 224N, 226P, 226N that is between corresponding instances of gate 209 or that is adjacent to a corresponding instance of gate 209, the given portion being doped with an appropriate conductivity-type dopant.

Cell region 202 further includes cut-gate (CG) shapes/patterns 210. Long axes of cut patterns 210 extend substantially parallel to the X-axis. In general, where a given gate underlies a given CG shape such that a portion of the given gate is overlapped by the given CG shape, the given CG shape is used to indicate that the overlapped portion of the given gate will be removed during fabrication of a corresponding semiconductor device. A width between each of gates 209 is equal to a width W2.

In some embodiments, the transistors of cell region 202 are FETs. In some embodiments, ARs 224P, 226P are doped with a first conductivity-type dopant, and ARs 224N, 226N are doped with a second conductivity-type dopant.

Regarding FIG. 2B, in some embodiments that are configured according to complementary metal oxide semiconductor (CMOS) technology, e.g., FIGS. 3A-3B, 4B-4F, 5B-5C, or the like, the following is true: ARs 224P, 226P are doped with a first conductivity-type dopant such that the transistors corresponding to ARs 224P, 226P are PFETs; ARs 224N, 226N are doped with a second conductivity-type dopant such that the transistors corresponding to ARs 224N, 226N are NFETs; and ARs 224P, 226P are formed in corresponding N-wells (see FIGS. 3A-3B).

Figure 3A:
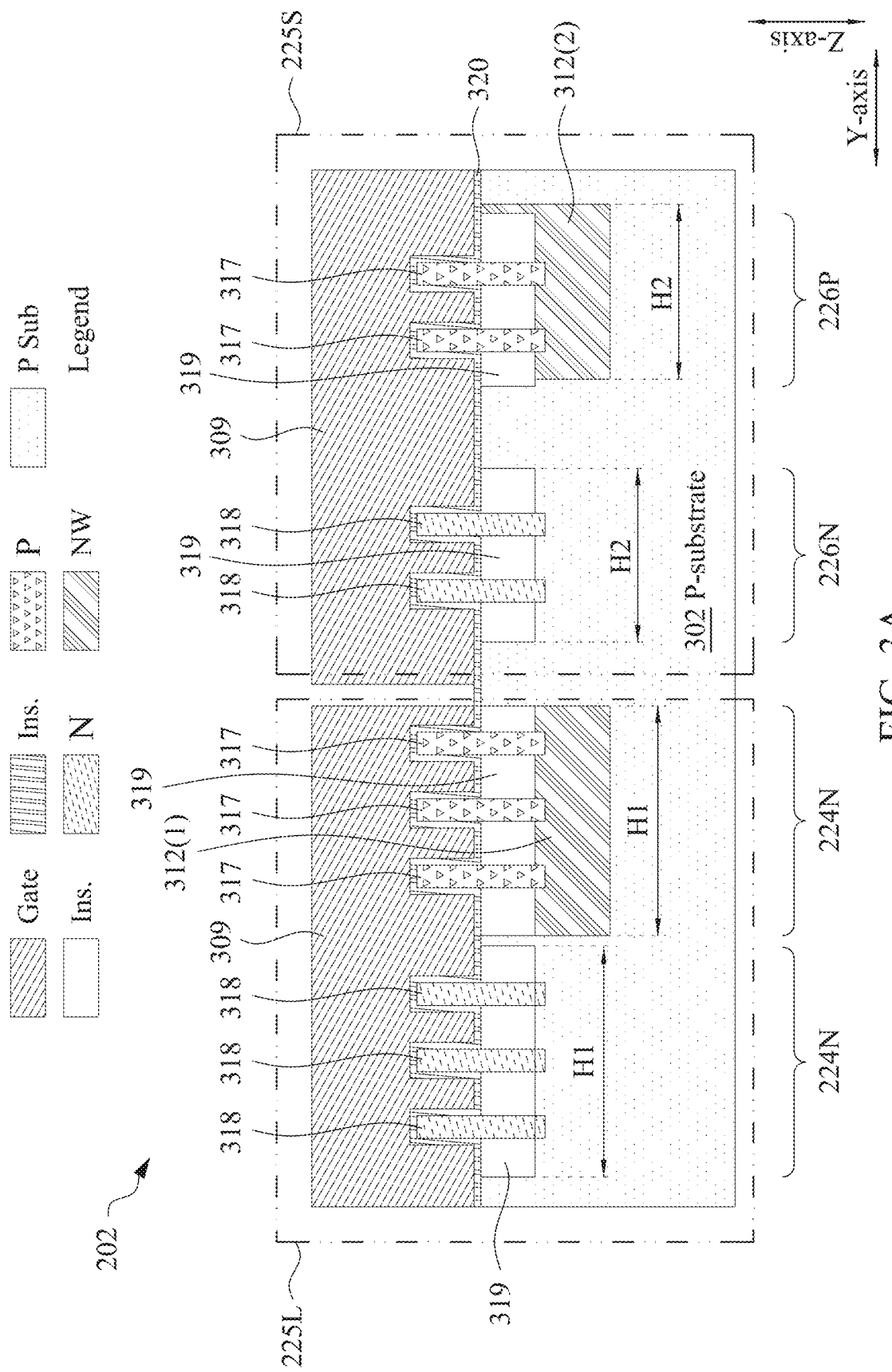
FIGS. 3A-3B are corresponding cross sectional views of cell regions that are included in a semiconductor device, in accordance with some embodiments.
Figure 3B:
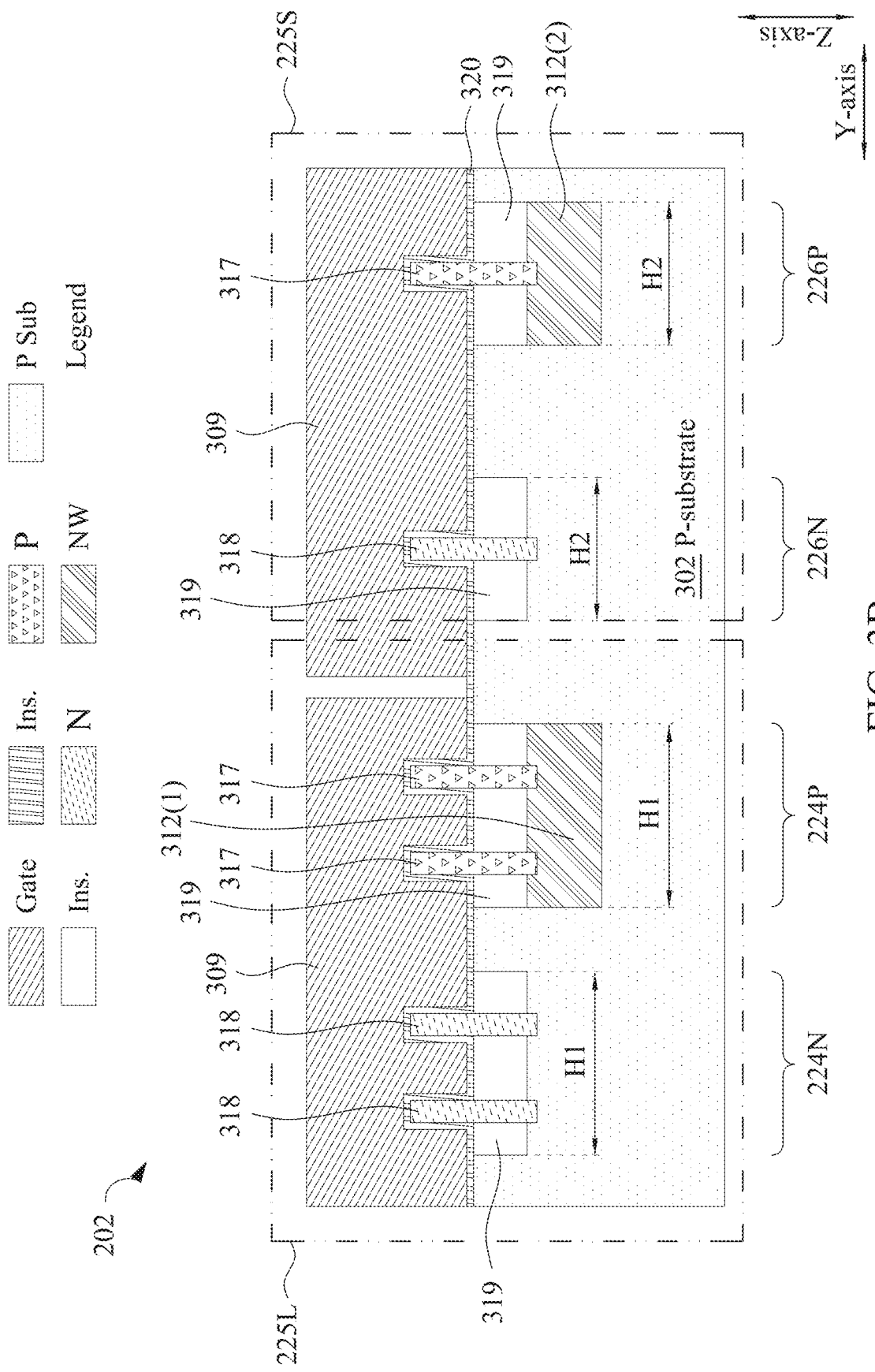

In some embodiments, the transistors of cell region 202 have a fin-FET architecture (FIGS. 3A-3B). In some embodiments, the transistors of cell region 202 have a planar-transistor architecture. In some embodiments, the transistors of cell region 202 have an architecture other than the fin-FET architecture or the planar-transistor architecture.

The channels of transistors in each of ARs 224P, 224N have a first channel-size. The first channel-size is proportional at least in part to height H1. The channels of transistors in each of ARs 224P, 224N have the first channel-size. In some embodiments which use the fin-FET architecture, the first channel-size is at least in part proportional to the number of fins intersected by a corresponding portion of a given one of gates 209. In some embodiments, the number of fins in ARs 224P, 224N is a positive integer number X. The channels of transistors in each of ARs 226P, 226N have a second channel-size, where the second channel size is smaller than the first channel-size. The second channel-size is proportional at least in part to height H2. The channels of transistors in each of ARs 226P, 226N have the second channel-size. In some embodiments which use the fin-FET architecture, the second channel-size is at least in part proportional to the number of fins intersected by a corresponding portion of a given one of gates 209. In some embodiments, the number of fins in ARs 226P, 226N is a positive integer number Y, where Y<X.

Transistors with the second channel-size have a greater propagation delay than the transistors with the first channel-size. In some embodiments, transistors with the second channel-size have a propagation delay that emulates the propagation delay of the combinational logic 201 in a processor stage.

Figure 4A:
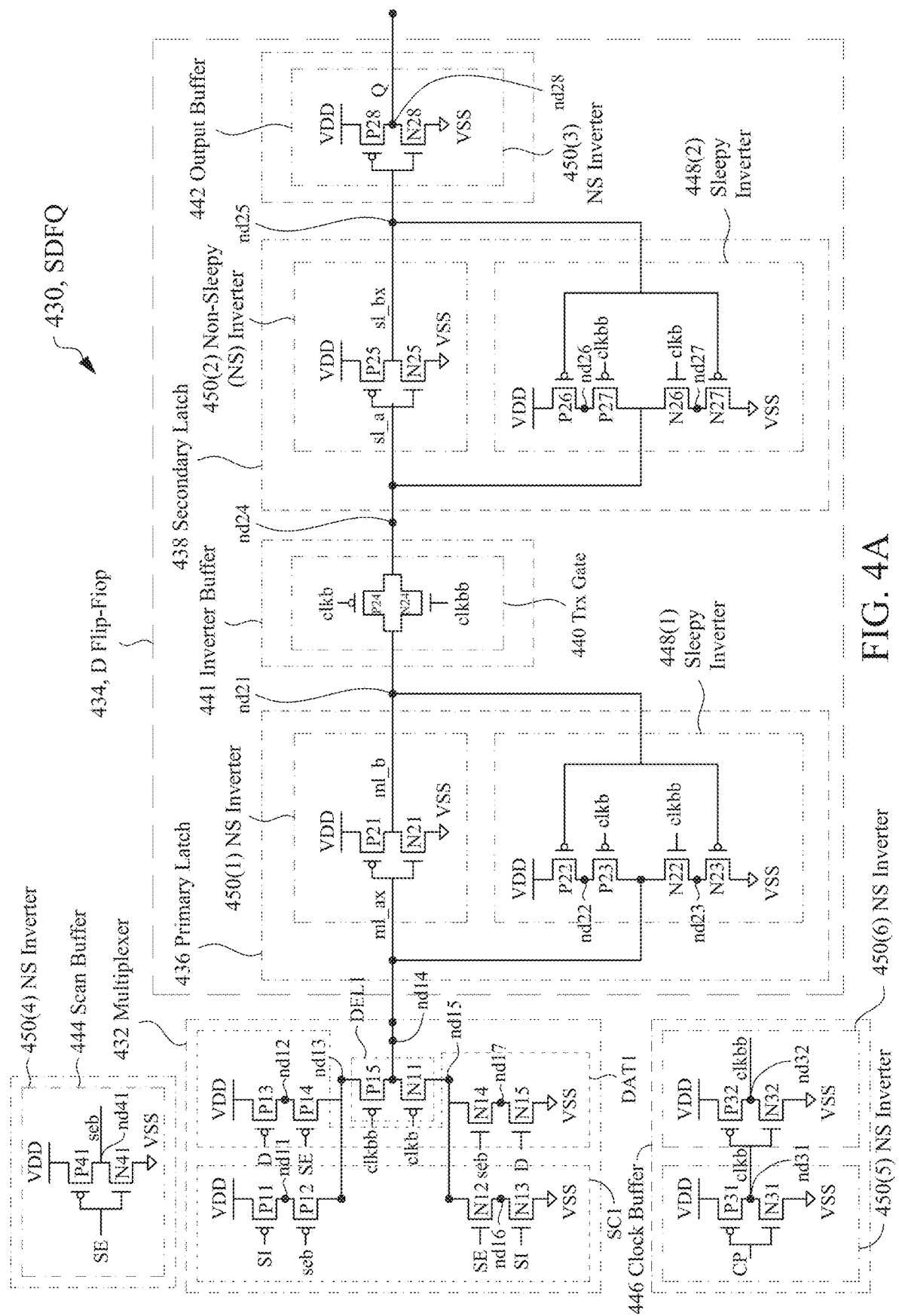
FIG. 4A is a schematic circuit diagram, in accordance with some embodiments.
Figure 4B:
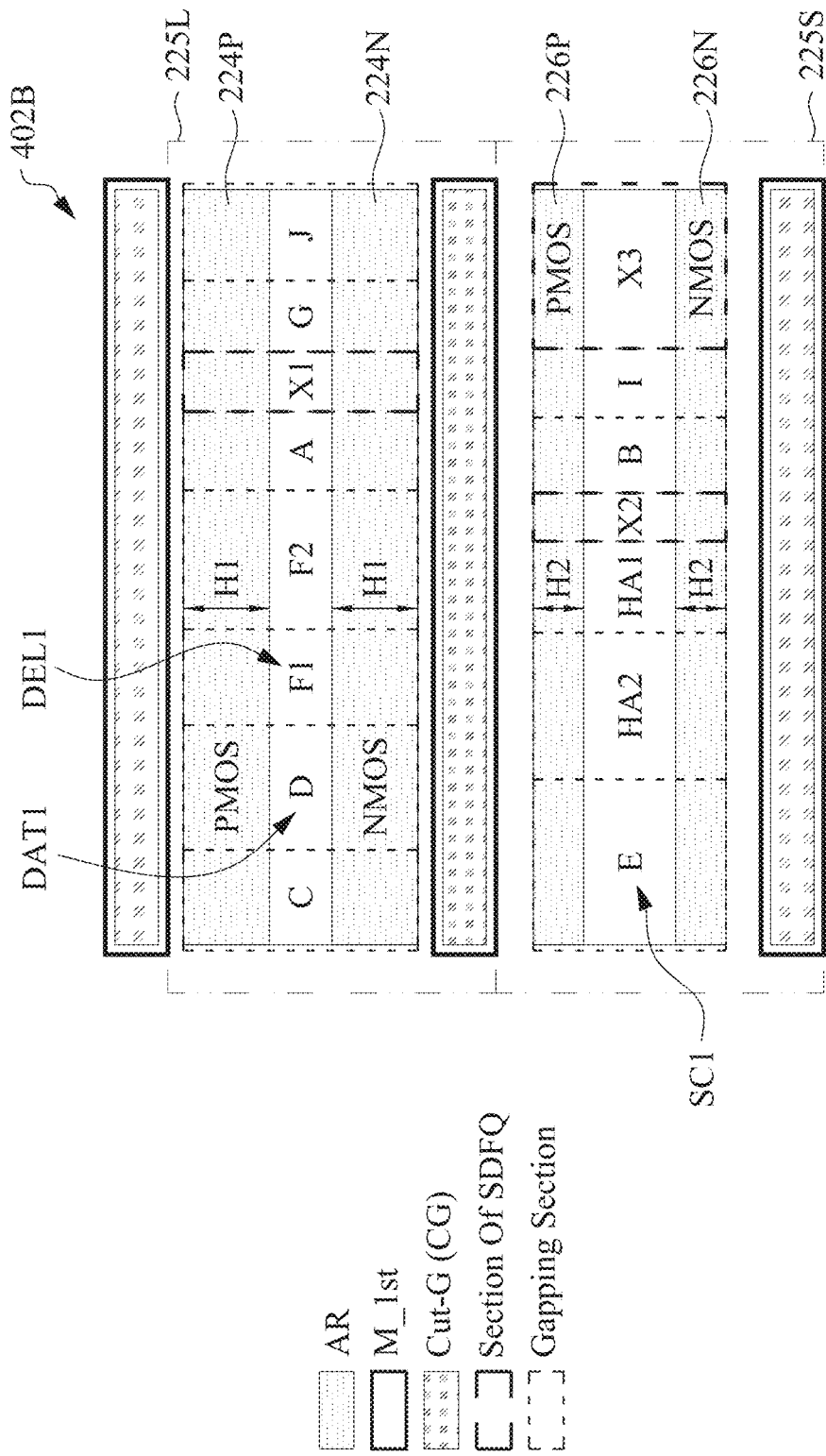
FIGS. 4B-4F are corresponding layout diagrams, in accordance with some embodiments.

In FIG. 2B, the transistors of cell region 202 are arranged to function as an active circuit. In some embodiments, the active circuit is a scan insertion D flip-flop (SDFQ) (FIGS. 4A, 4B). The number of gates 209 shown in FIG. 2B, and therefore the corresponding number of transistors, has been reduced for simplicity of illustration. As a practical matter, the active circuit defined by the transistors of cell region 202 determines the number of transistors to be included in cell region 202, and thus the number of gates 209 to be included in cell region 202.

In FIG. 2B, one instance of gate 209 has been replaced by an insulating dummy gate (IDG) 211. In some embodiments, an IDG is a dielectric structure that includes one or more dielectric materials and functions as an electrical isolation structure. Accordingly, an IDG is not a structure that is electrically conductive and thus does not function, e.g., as an active gate of a transistor. An IDG includes one or more dielectric materials and functions as an electrical isolation structure. In some embodiments, an IDG is based on a gate as a precursor. In some embodiments, a dummy gate includes a conductor, a gate-insulator layer, (optionally) one or more spacers, or the like. In some embodiments, an IDG is formed by first forming a gate, e.g., a dummy gate, sacrificing/removing (e.g., etching) the conductor of the gate to form a trench, (optionally) removing a portion of a substrate that previously had been under the conductor to deepen the trench, and then filling the trench with one or more dielectric materials such that the physical dimensions of the resultant electrical isolation structure, i.e., the IDG, are similar to the dimensions of the dummy gate which was sacrificed, or the combination of the gate which was sacrificed and the removed portion of the substrate. In some embodiments, an IDG is a dielectric feature that includes one or more dielectric materials (e.g., oxide, nitride, oxynitride, or other suitable materials), and functions as an isolation feature. In some embodiments, an IDG is a continuous polysilicon on oxide diffusion (OD) edge structure and is referred to as a CPODE structure.

FIGS. 3A-3B are corresponding cross sectional views of a cell region that is included in a semiconductor device, in accordance with some embodiments.

In particular, FIGS. 3A-3B are cross sectional views of a cell region 202 of a semiconductor device based on cell region 202 of FIG. 2B in a circumstance of CMOS technology in which cell region 202 includes N-wells 312(1) and 312(2). FIGS. 3A-3B correspond to section lines 3A-3A' and 3B-3B' of FIG. 2B. FIG. 3A corresponds to a fin-FET architecture where X=3 and Y=2. FIG. 3B corresponds to a fin-FET architecture where X=2 and Y=1. In other embodiments, X is greater than 3 and Y is greater than 2 as long as X>Y.

Each of FIGS. 3A-3B includes: a P-type substrate 302; N-wells 312(1) and 312(2) formed in substrate 302; P-type fins 317 formed partially in corresponding N-wells 312(1)-312(2) relative to the Z-axis; N-type fins 318 formed partially in substrate 302 relative to the Z-axis; fin-insulator 319 formed against fins 317 and 318; and a gate insulating layer 320 formed on fins 317 and 318, and on exposed upper surfaces of N-wells 312(1)-312(2), fin-insulator 319 and substrate 302; and gate 309. H1 is greater in FIG. 3A than H1 in FIG. 3B. H2 is greater in FIG. 3A than H2 in FIG. 3B.

In some embodiments, P-type substrate 302 includes silicon, silicon germanium (SiGe), gallium arsenic, or other suitable semiconductor materials. ARs 224P, 224N, 226P, 226N are formed in or over P-type substrate 302, using one or more masks corresponding to one or more active regions in the layout diagrams described herein. The gate insulating layer 320 is deposited over P-type substrate 302. Example materials of the gate insulating layer 320 include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials.

In FIG. 3A and FIG. 3B, in subregion 225L, fins 318 are the left-most fins with respect to the Y-axis, and fins 317 are to the right of fins 318. In FIG. 3A and FIG. 3B, in subregion 225S, fins 318 are the left-most fins with respect to the Y-axis, and fins 317 are to the right of fins 318. In other embodiments, fins 317 are the left most fins with respect to the Y-axis in subregion 225L. In some embodiments, in each of subregions 225L and 225S, fins 317 are to the left of fins 318.

FIG. 4A is a schematic circuit diagram, in accordance with some embodiments.

More particularly, FIG. 4A is a schematic circuit diagram of a scan D FF (SDFQ) 430. SDFQ 430 is an example of how the transistors of FIGS. 1, 2, 3A-3B or the like are arranged to function as an active circuit.

FIG. 4A is a transmission-gate-based design (discussed below). SDFQ 430 is an edge-triggered arrangement that is triggered on a rising edge (positive edge) of a clock signal. Variations of SDFQ 430 are triggered on the falling edge (negative edge) of the clock signal. Other variations of SDFQ 430 are double edge-triggered, i.e., are trigged by both the rising edge (positive edge) and falling edge (negative edge) of the clock signal.

In FIG. 4A, SDFQ 430 includes a multiplexer 432, a D flip-flop 434, a scan buffer 444 and a clock buffer 446.

In FIG. 4A, scan buffer 444 receives a Scan/Test Enable (SE) signal that selects between normal, i.e., non-scan/test, operation relative to data signal D or scan/test operation relative to a Scan Input (SI) signal. Scan buffer 444 includes a non-sleepy (NS) inverter 450(4), the latter including series-connected PFET P41 and NFET N41. An NS inverter, e.g., 450(4) is a counterpart to a sleepy inverter, e.g., 448(1) (discussed below). Hereinafter, transistors whose reference alphanumeric is prefixed with the uppercase letter P, e.g., P41, are PFETs, and transistors whose reference alphanumeric is prefixed with the uppercase letter N, e.g., N41, are NFETs.

In NS inverter 450(4), transistor P41 is connected between a node having a first reference voltage, e.g., VDD, and a node nd41. Transistor N41 is connected between node nd41 and a node having a second reference voltage, e.g., VSS. The gate terminals of each of transistors P41 and N41 are connected together and are configured to receive signal SE. Node nd41 has a signal seb which is the inversion of signal SE.

In FIG. 4A, clock buffer 446 includes a pair of NS inverters 450(5) and 450(6). NS inverter 450(5) includes series-connected transistors P31 and N31. Transistor P31 is connected between a node having voltage VDD and a node nd31. Transistor N31 is connected between node nd31 and a node having voltage VSS. The gate terminals of each of transistors P31 and N31 are connected together and are configured to receive a clock signal CP. Node nd31 represents an output node of NS inverter 450(5) and has a clock signal clkb which represents the inversion of clock signal CP.

In clock buffer 446, NS inverter 450(6) includes series-connected transistors P32 and N32. Transistor P32 is connected between a node having voltage VDD and a node nd32. Transistor N32 is connected between node nd32 and a node having voltage VSS. The gate terminals of each of transistors P32 and N32 are connected together and to node nd31, and thus are configured to receive clock signal clkb. Node nd32 represents an output node of NS inverter 450(6) and has a clock signal clkbb which represents the inversion of clock signal clkb.

In FIG. 4A, multiplexer 432 includes transistors P11-P15 and N11-N15. Transistor P11 is connected between a node having voltage VDD and a node nd11. The gate terminal of transistor P11 receives signal SI. Transistor P12 is connected between node nd11 and a node nd13. The gate terminal of transistor P12 receives signal seb. Transistor P13 is connected between a node having voltage VDD and a node nd12. The gate terminal of transistor P13 receives input signal D. Transistor P14 is connected between node nd12 and node nd13. The gate terminal of transistor P14 receives signal SE. Transistor P15 is connected between node nd13 and a node nd14 which has signal m1_ax. The gate terminal of transistor P15 receives signal clkbb. Transistor N11 is connected between node nd14 and a node nd15. The gate terminal of transistor N11 receives signal clkb. Transistor N12 is connected between node nd15 and a node nd16. The gate terminal of transistor N12 receives signal SE. Transistor N13 is connected between node nd16 and a node having voltage VSS. The gate terminal of transistor N13 receives signal SI. Transistor N14 is connected between node nd15 and a node nd17. The gate terminal of transistor N14 receives signal seb. Transistor N15 is connected between node nd17 and a node having voltage VSS. The gate terminal of transistor N15 receives input signal D.

In multiplexer 432, transistors P11, P12, N12, N13 define a group of scan transistors SC1 (scan group SC1) of multiplexer 432. Scan group SC1 is used for selecting the data input signal D. In some embodiments, components of transistors P11, P12 are in AR 126 P of FIG. 1, AR 226P of FIGS. 2B and 3A-3B, or the like. In some embodiments, components of transistors N12, N13 are in AR 126N of FIG. 1, AR 226N of FIGS. 2B and 3A-3B, or the like.

Transistors P13, P14, N14, N15 define a group of data transistors DAT1 (data group DAT1) of multiplexer 432. Data group DAT1 is used for selecting the scan input signal SI. In some embodiments, components of transistors P13, P14 are in AR 124P of FIG. 1, AR 224P of FIGS. 2B and 3A-3B, or the like. In some embodiments, components of transistors N14, N15 are in AR 124N of FIG. 1, AR 224N of FIGS. 2B and 3A-3B, or the like.

Transistors P15, N11 define a group of delay transistors DEL1 (delay group DEL1) of multiplexer 432. Delay group DEL1 is used for delaying the propagation of the selected input, namely either SI or D, through multiplexer 432. In some embodiments, transistor P15 is formed with AR 124P of FIG. 1, AR 224P of FIGS. 2B and 3A-3B, or the like. In some embodiments, transistor N11 is formed with AR 124N of FIG. 1, AR 224N of FIGS. 2B and 3A-3B, or the like.

Because the transistors of scan group SC1 of multiplexer 432 are formed in ARs 126P, 226P with the smaller channel size as compared to the transistors of data group DAT1, the scan transistors of scan group SC1 have a greater propagation delay as compared to the transistors of data group DAT1. In terms of when a signal reaches internal node nd14, the greater propagation delay of the transistors of scan group SC1 is similar or equal to the propagation delay of combinational logic 201 (FIG. 2A) plus the propagation delay of the transistors in delay group DAT1.

In FIG. 4A, D flip-flop 434 includes a primary latch 436, an internal buffer 441, a secondary latch 438 and an output buffer 442.

Primary latch 436 includes an NS inverter 450(1) and a sleepy inverter 448(1). NS inverter 450(1) includes transistors P21 and N21. Transistor P21 is connected between a node having voltage VDD and a node nd21. Transistor N21 is located node nd21 and a node having voltage VSS. The gate terminals of transistors P21 and N21 are connected together and to node nd14, and thus are configured to receive signal m1_ax. As such, signal m1_ax represents the input signal of D flip-flop 434. Node nd21 represents an output node of NS inverter 450(1) and has a signal m1_b which represents the inversion of signal m1_ax.

In primary latch 436, sleepy inverter 448(1) includes transistors P22-P23 and N22-N23. Transistor P22 is connected between a node having voltage VDD and a node nd22. Transistor P23 is connected between node nd22 and node nd14. The gate terminal of transistor P23 receives signal clkb. Transistor N22 is connected between node nd14 and a node nd23. The gate terminal of transistor N22 receives signal clkbb. In some embodiments, the gate terminal of transistor N22 receives signal CP instead of signal clkbb. Transistor N23 is connected between node nd23 and a node having voltage VSS. The gate terminal of transistor N22 receives signal clkbb. Sleepy inverter 448(1) can be put into a sleep mode due to transistors P23 and N22. The gate terminals of transistors P22 and N23 are connected together and to node nd21. Accordingly, sleepy inverter 448(1) feeds-back an inverted version of signal m1_b (from node nd21) to node nd14.

In FIG. 4A, internal buffer 441 includes a transmission gate 440, the latter including transistors P24 and N24. The inclusion of transmission gate 440 in SDFQ 430 is referred to as a transmission-gate-based design. Transistors P24 and N24 are connected in parallel between node nd21 and a node nd24. The gate terminal of transistor P24 receives signal clkb. The gate terminal of transistor N24 receives signal clkbb. Node nd24 has a signal s1_a.

In D flip-flop 434, secondary latch 438 includes an NS inverter 450(2) and a sleepy inverter 448(2). NS inverter 450(2) includes transistors P25 and N25. Transistor P25 is connected between a node having voltage VDD and a node nd25. Transistor N25 is connected between node nd25 and a node having voltage VSS. The gate terminals of transistors P25 and N25 are connected together and to node nd24, and thus are configured to receive signal s1_a. Node nd25 represents an output node of NS inverter 450(2) and has a signal s1_bx which represents the inversion of signal s1_a.

In secondary latch 438, sleepy inverter 448(2) includes transistors P26-P27 and N26-N27. Transistor P26 is connected between a node having voltage VDD and a node nd26. Transistor P27 is connected between node nd26 and node nd24. The gate terminal of transistor P27 receives signal clkbb. Transistor N26 is connected between node nd24 and a node nd27. Transistor N27 is connected between node nd27 and a node having voltage VSS. The gate terminal of transistor N26 receives signal clkb. Sleepy inverter 448(2) can be put into a sleep mode due to transistors P27 and N26. The gate terminals of transistors P26 and N27 are connected together and to node nd25. Accordingly, sleepy inverter 448(2) feeds-back an inverted version of signal s1_bx (from node nd25) to node nd24.

In D flip-flop 434, output buffer 442 includes an NS inverter 450(3), the latter including transistors P28 and N28. Transistor P28 is connected between a node having voltage VDD and a node nd26. Transistor N28 is connected between node nd28 and a node having voltage VSS. The gate terminals of transistors P28 and N28 are connected together and to node nd25, and thus are configured to receive signal s1_bx. Node nd26 represents an output node of NS inverter 450(3), and thus of D flip-flop 434. Furthermore, node nd26 also represents the output node of SDFQ 400. Node 464 has signal Q which represents the inversion of signal s1_bx.

FIG. 4A assumes that SDFQ 430 is triggered on the rising edge (positive edge) of clock signal CP. Variations to make SDFQ 430 be triggered on the falling edge (negative edge) of a clock signal include the following. Instead of receiving clock signal CP, the gate terminals of each of transistors P31 and N31 are configured to receive a clock signal CPN, where CPN is an inverted version of clock signal CP. Instead of receiving signal clkbb, the gate terminal of transistor P15 receives signal clkb. Instead of receiving signal clkb, the gate terminal of transistor N11 receives signal clkbb. Instead of receiving signal clkb, the gate terminal of transistor P23 receives signal clkbb. In some embodiments, the gate terminal of transistor P23 receives signal CPN instead of signal clkbb. Instead of receiving signal clkbb, the gate terminal of transistor N22 receives signal clkb. Instead of receiving signal clkb, the gate terminal of transistor P24 receives signal clkbb. Instead of receiving signal clkbb, the gate terminal of transistor N24 receives signal clkb. Instead of receiving signal clkbb, the gate terminal of transistor P27 receives signal clkb. Instead of receiving signal clkb, the gate terminal of transistor N26 receives signal clkbb.

In FIG. 4A, D flip-flop 434 is a transmission-gate-based design because internal buffer 441 thereof includes transmission gate 440. In some embodiments, D flip-flop 434 is a stack-gate-based design (not shown). More particularly, whereas internal buffer 441 of FIG. 4A includes transmission gate 440, a stack-gate-based version of D flip-flop 434 includes a version of internal buffer 441 which is stack-gate-based. In some embodiments, the stack-gate-based version of internal buffer 441 includes a sleepy inverter (not shown) in place of transmission gate 440, where a sleepy inverter is an example of a stack-gate-based device. Like transmission gate 440, the output of the alternative sleepy inverter is connected to node nd24. In contrast to transmission gate 440, the input of the alternative sleepy inverter is not connected to node nd21 but instead is connected to node nd14.

FIGS. 4B-4F are corresponding layout diagrams 402B-402F, in accordance with some embodiments.

Each of layout diagrams 402B-402F is an example of layout diagram of cell region 202 of FIG. 2B. FIGS. 4B-4F include different arrangements of the transistors of SDFQ 430 of FIG. 4A in cell region 202 of FIG. 2B. Gates 209 and cut patterns 210 are not included in FIG. 4B-4F for simplicity of illustration.

In FIGS. 4B-4F, sections A, B, C, D, E, F1, F2, G, HA1 HA2, I, J correspond to different components of SDFQ 430 as described in Table 1 below.

TABLE 1

| Component from FIG. 4A | Section |
| --- | --- |
| 450(5) NS Inverter of Clock Buffer 446 | A |
| 450(6) NS Inverter of Clock Buffer 446 | B |
| 450(4) NS Inverter of 444 Scan Buffer | C |

TABLE 1-continued

| Component from FIG. 4A | Section |
| --- | --- |
| DAT1 Data Transistors of 432 Multiplexer | D |
| SC1 Scan Transistors of 432 Multiplexer | E |
| DEL1 Delay Transistors of 432 Multiplexer | F1 |
| 448(1) Sleepy Inverter of Primary Latch 436 | F2 |
| 450(1) NS Inverter of Primary Latch | G |
| 440 Transmission Gate of 441 Internal Buffer | HA1 |
| 448(2) Sleepy Inverter of 438 Secondary Latch | HA2 |
| 450(2) NS Inverter of 438 Secondary Latch | I |
| 450(3) NS Inverter of 442 Output Buffer | J |

Also shown in FIG. 4B-4F are gapping sections. A gapping section does not include any of the PMOS or NMOS transistors of SDFQ 430 shown in FIG. 4A. The gapping section includes 1) includes passive components of SDFQ 430 that are not shown in 4A, 2) active or passive components of other semiconductor devices that are not part of SDFQ 430, 3) dummy components, and/or 4) a spacing section with neither active, passive, or dummy components. Gapping sections are identified with the letter "X" followed by a number to specifically identify the gapping section. It should be noted that when a gapping section is between pair of any two of sections A, B, C, D, E, F1, F2, G, HA1 HA2, I, J then the pair is considered adjacent to one another with respect to SDFQ 430 but is not abutting with respect to each other. Relative to the X-axis, gapping sections having different sizes/dimensions due to space-packing considerations which depend upon the sequence of sections in subregion 225L and the sequence of sections in subregion 225S.

Figure 4C:
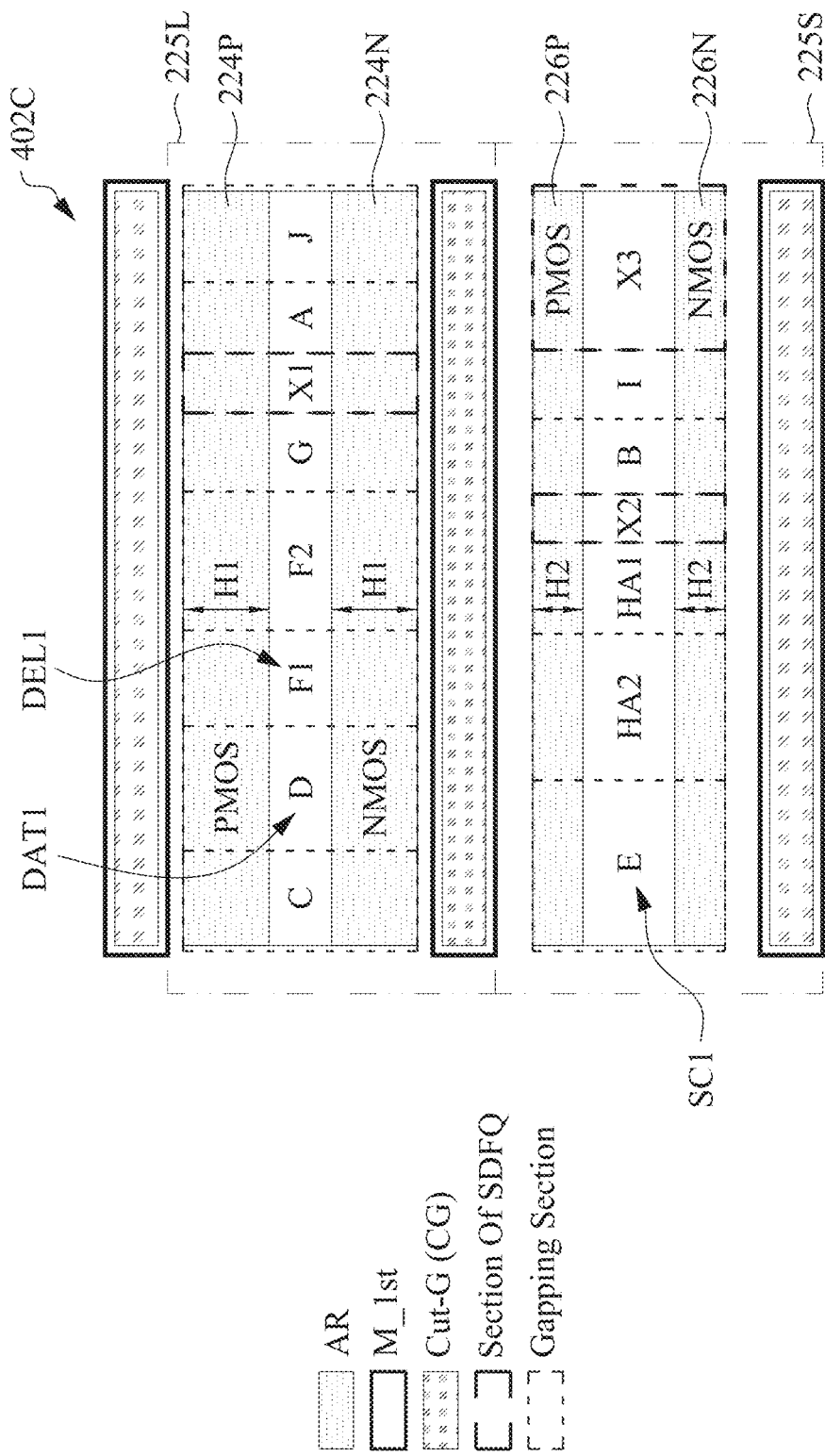

In each of FIGS. 4B-4C, The PMOS transistors having components in sections A, C, D, F1, F2, G, and J of subregion 225L are formed in AR 224P.

The NMOS transistors having components in sections A, C, D, F1, F2, G, and J of subregion 225L are formed in AR 224N.

The PMOS transistors having components in sections B, E, HAL HA2, and I of subregion 225S are formed in AR 226P.

The NMOS transistors having components in sections B, E, HAL HA2, and I, of subregion 225S are formed in AR 226N.

In FIG. 4B, the left-to-right sequence of the adjacent and abutting sections in subregion 225L is C:D:F1:F2:A:X1:G:J. In FIG. 4C, the left-to-right sequence of the adjacent and abutting sections in subregion 225L is C:D:F1:F2:G:X1:A:J. In FIG. 4C, sections A and G are reversed in position as compared to the positions of sections A and G in FIG. 4B, i.e., G is positioned before A in the left to right sequence in FIG. 4C versus section A being positioned before G in the left-to-right sequence in FIG. 4B. Accordingly, in FIG. 4C, the left-to-right sequence of the adjacent and abutting sections in subregion 225L is C:D:F1:F2:G:X1:A:J.

In each of FIGS. 4B-4C, the left-to-right sequence of the adjacent and abutting sections in subregion 225S is E:HA2:HA1:X2:B:I:X3.

Figure 4D:
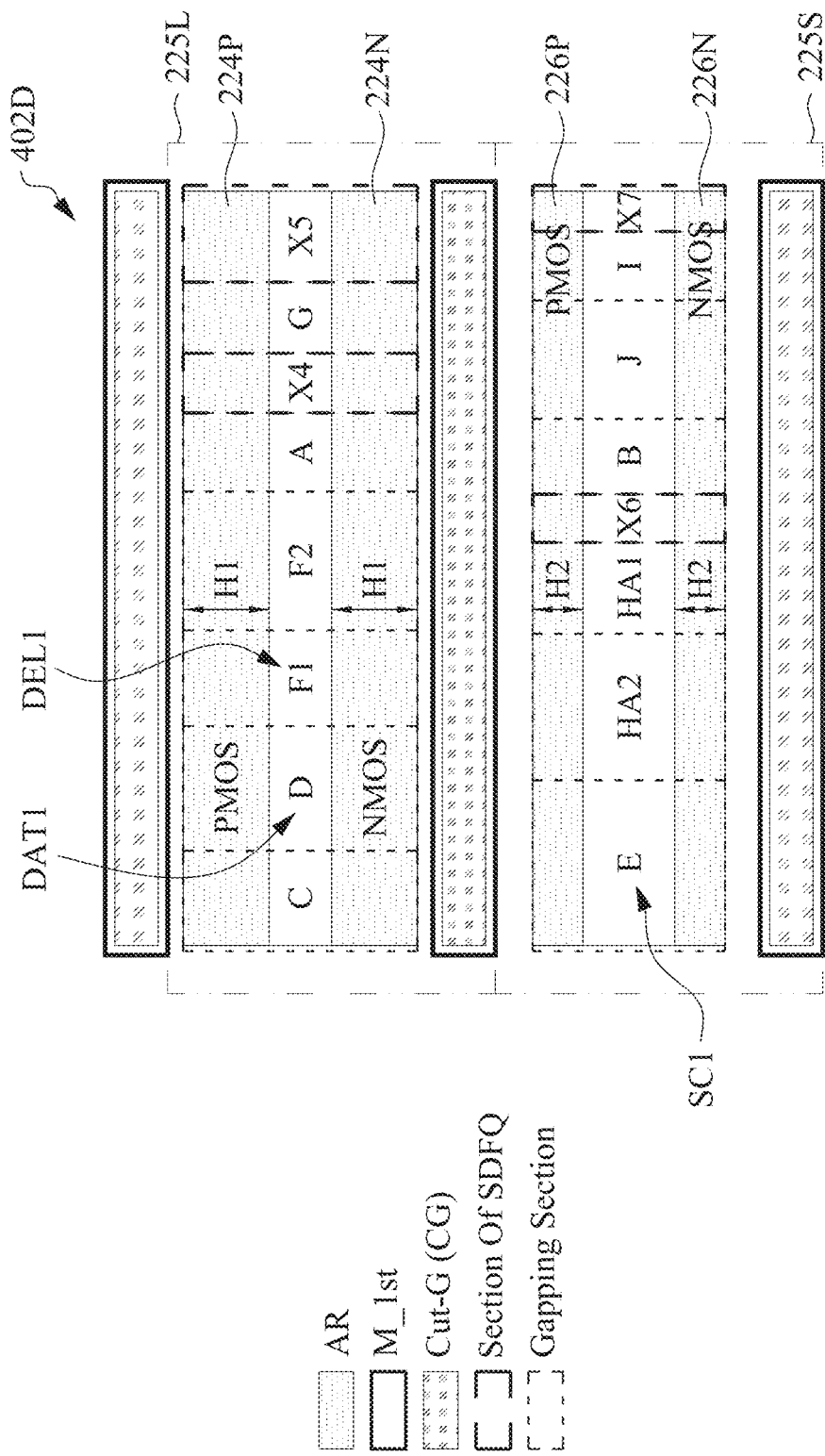
Figure 4E:
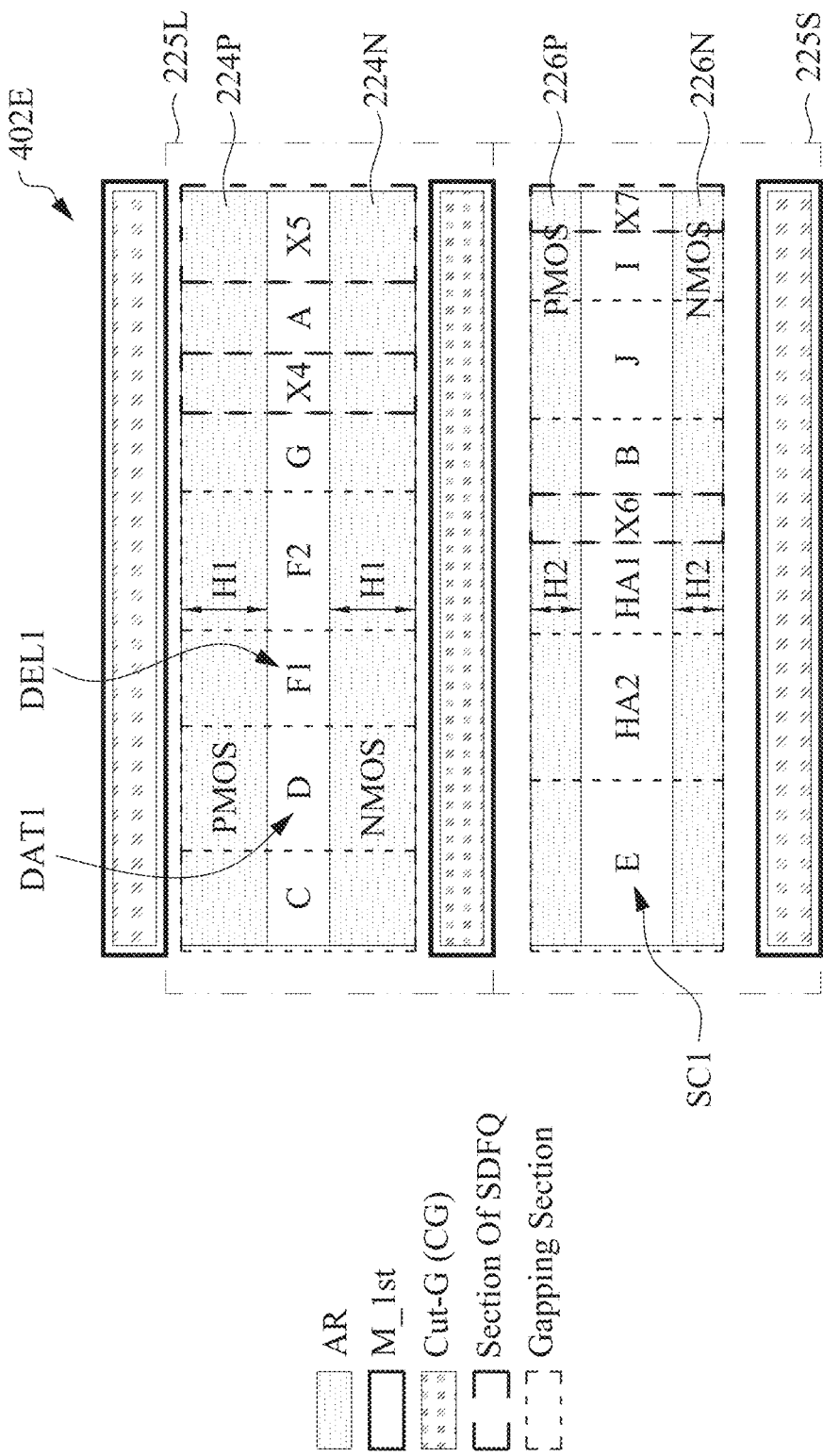

In each of FIGS. 4D-4E, section J is in subregion 225S as compared to section J being in subregion 225L in each of FIGS. 4B-4C.

Accordingly, the PMOS transistors having components in sections A, C, D, F1, F2, and G of subregion 225L are formed in AR 224P.

The NMOS transistors having components in sections A, C, D, F1, F2, and G of subregion 225L are formed in AR 224N.

The PMOS transistors having components in sections B, E, HAL HA2, I, and J of subregion 225S are formed in AR 226P.

The NMOS transistors having components in sections B, E, HAL HA2, I, and J of subregion 225S are formed in AR 226N.

In FIG. 4D, the left-to-right sequence of the adjacent and abutting sections in subregion 225L is C:D:F1:F2:A:X4:G:X5. In FIG. 4E, the left-to-right sequence of the adjacent and abutting sections in subregion 225L is C:D:F1:F2:G:X4:A:X5. In FIG. 4D, sections A and G are reversed in position as compared to the positions of sections A and G in FIG. 4E, i.e., A is positioned before G in the left to right sequence in FIG. 4D versus section G being positioned before A in the left-to-right sequence in FIG. 4E. Accordingly, in FIG. 4E, the left-to-right sequence of the adjacent and abutting sections in subregion 225L is C:D:F1:F2:G:X4:A:X5.

In each of FIGS. 4D-4E, the left-to-right sequence of the adjacent and abutting sections in subregion 225S is E:HA2:HA1:X6:B:J:I:X7.

Figure 4F:
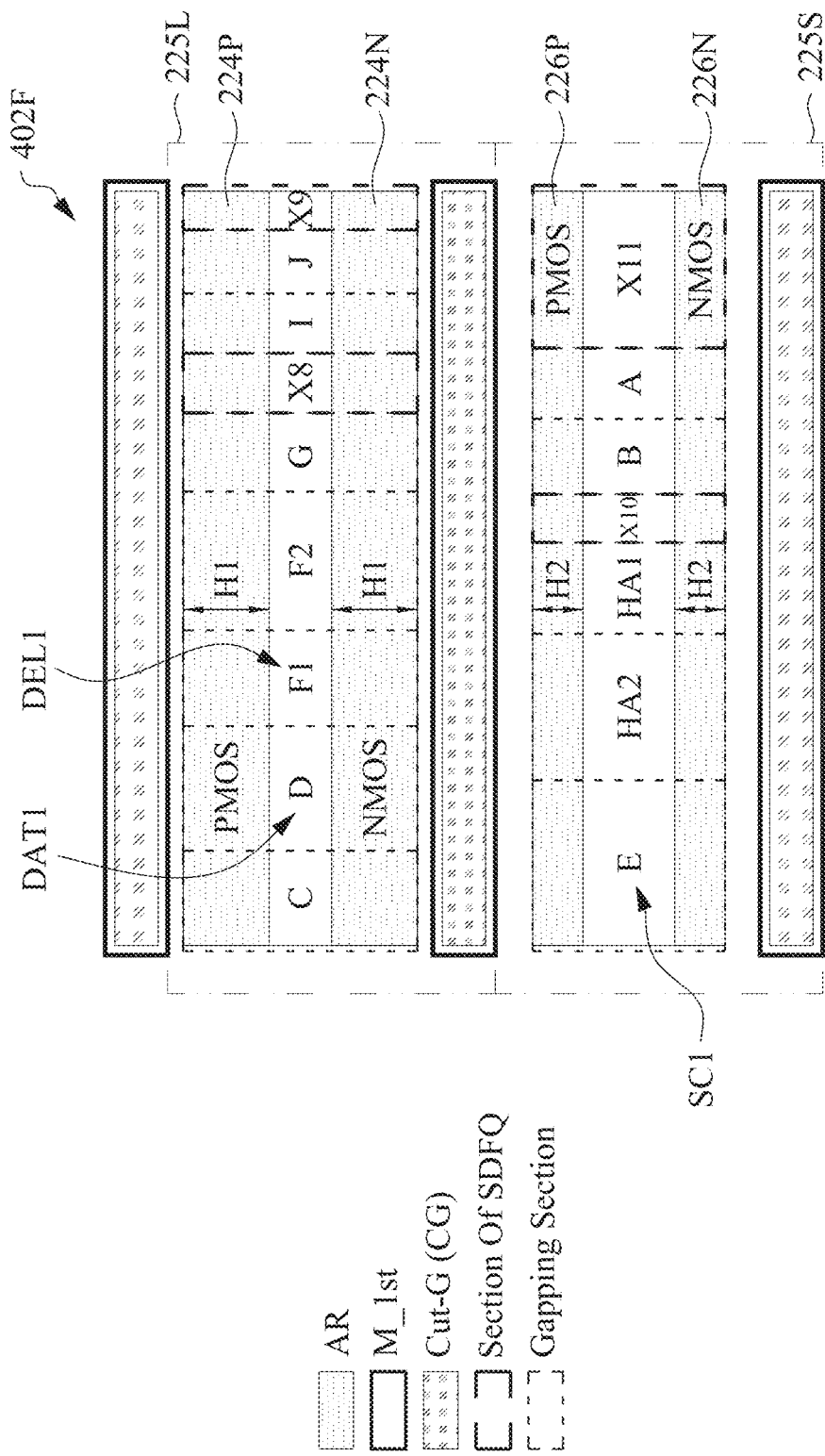

In FIG. 4F, the left-to-right sequence of the adjacent and abutting sections in subregion 225L is C:D:F1:F2:G:X8:I:J:X9. In FIG. 4F, the left-to-right sequence of adjacent and abutting sections in subregion 225S is E:HA2:HA1:X10:B:A:X1. Thus, unlike the embodiments in FIGS. 4B-4E, both sections I, J are in subregion 225L of FIG. 4F. Also, unlike the embodiments in FIGS. 4B-4E, section A is in subregion 225S of FIG. 4F.

In some embodiments, subregions 225L and subregion 225S are configured as shown in FIG. 3A with respect to layout diagrams 402B-402F of FIGS. 4B-4F. In some embodiments, subregions 225L and subregion 225S are configured as shown in FIG. 3B with respect to layout diagrams 402B-402F of FIGS. 4B-4F.

It is to be recalled that FIGS. 4B-4F are example arrangements of the transistors of SDFQ 434 of FIG. 4A, where SDFQ 434 includes the transistors of scan group SC1, data group DAT1 and delay group DEL1 of multiplexer 432, and that SDFQ 434 of FIG. 4A is an example of FF2 of FIG. 2A. According to another approach similar to FIG. 2A, the counterpart to FF2 of FIG. 2A is an SDFQ that includes transistors having a larger channel size and transistors having a smaller channel size, and the SDFQ includes a multiplexer. Regarding the transistors in the multiplexer according to the other approach, all of the transistors that would be counterparts of the transistors in scan group SC1 and data group DAT1 have the larger channel size, and all of the transistors that would be counterparts of the transistors in delay group DEL1 have the smaller channel size. Nevertheless, the other approach does not avoid the race condition. By contrast, some embodiments (e.g., FIGS. 4B-4F) of the present application advantageously avoid the race condition because the transistors of scan group SC1 have the smaller channel size (as discussed above) whereas the transistors of data group DAT1 have the larger channel size (as discussed above).

The race condition concerns the amount of time that a signal on node nd14 is held valid. According to the other approach, the bypass of the combinational logic results in the hold time of the signal SI being shorter than the hold time of the signal D, i.e., the falling edge of the signal SI races ahead of the falling edge of the signal D (the latter during non-scan/test operation), which causes improper latching of the signal SI by the D FF during scan/test operation. By contrast, some embodiments (e.g., FIGS. 4B-4F) of the present application advantageously avoid the race condition because the transistors of scan group SC1 have the smaller channel size (as discussed above) and thereby provide a choke whereas the transistors of data group DAT1 have the larger channel size (as discussed above), with a result that the hold time of the signal SI during scan-test operation is substantially the same as the hold time of the signal D during non-scan/test operation, i.e., the falling edge of the signal SI during scan/test operation does not race ahead of the falling edge of the signal D during non-scan/test operation.

In other words, there is a minimum amount of time that the signal SI has to be held in order for primary latch 436 to validly input the bit value of the signal SI at node nd21. If the bit value of the signal SI is not held for the minimum amount of time, then the bit value of the signal SI is not registered at node nd21. By making the scan group SC1 of transistors smaller, i.e., by creating a choke, a signal propagation delay is introduced which ensures that the bit value of the signal SI is held long enough at input node nd14 for primary latch 436 to register the bit value of the signal SI at node nd21.

In some embodiments, configuring the transistors of scan group SC1 to have the smaller channel size is referred to as configuring scan group SC1 to be a choke. Here, the term choke is not being used in the traditional sense associated with inductors and the blocking/choking of higher frequency signals while passing lower frequency signals. Rather, here, the term choke is being used in manner more like the term choke (or choke valve) is used in the context of a carburetor in an internal combustion engine carburation, wherein the choke (when engaged) reduces the volume of air reaching the carburetor. More particularly, here, the term choke is being used in the sense of representing a relatively slower propagation path as compared to otherwise configuring the transistors of scan group SC1 to having the larger channel size. As noted, the other approach configures all of the transistors in the multiplexer that would be counterparts of the transistors in delay group DEL1 to have the smaller channel size, i.e., to be a choke. As such, the other approach creates a choke that indiscriminately affects operation of the multiplexer during both scan/test operation and during non-scan/test operation, and thus the other approach fails to avoid the race condition. By contrast, configuring the transistors of scan group SC1 to have the smaller channel size as in some embodiments of the present application creates a choke which is discriminating in the effect upon operation of the multiplexer, i.e., creates a choke which achieves relatively slower propagation during scan/test operation than is achieved during non-scan/test operation, and thus avoids the race condition.

Figure 5A:
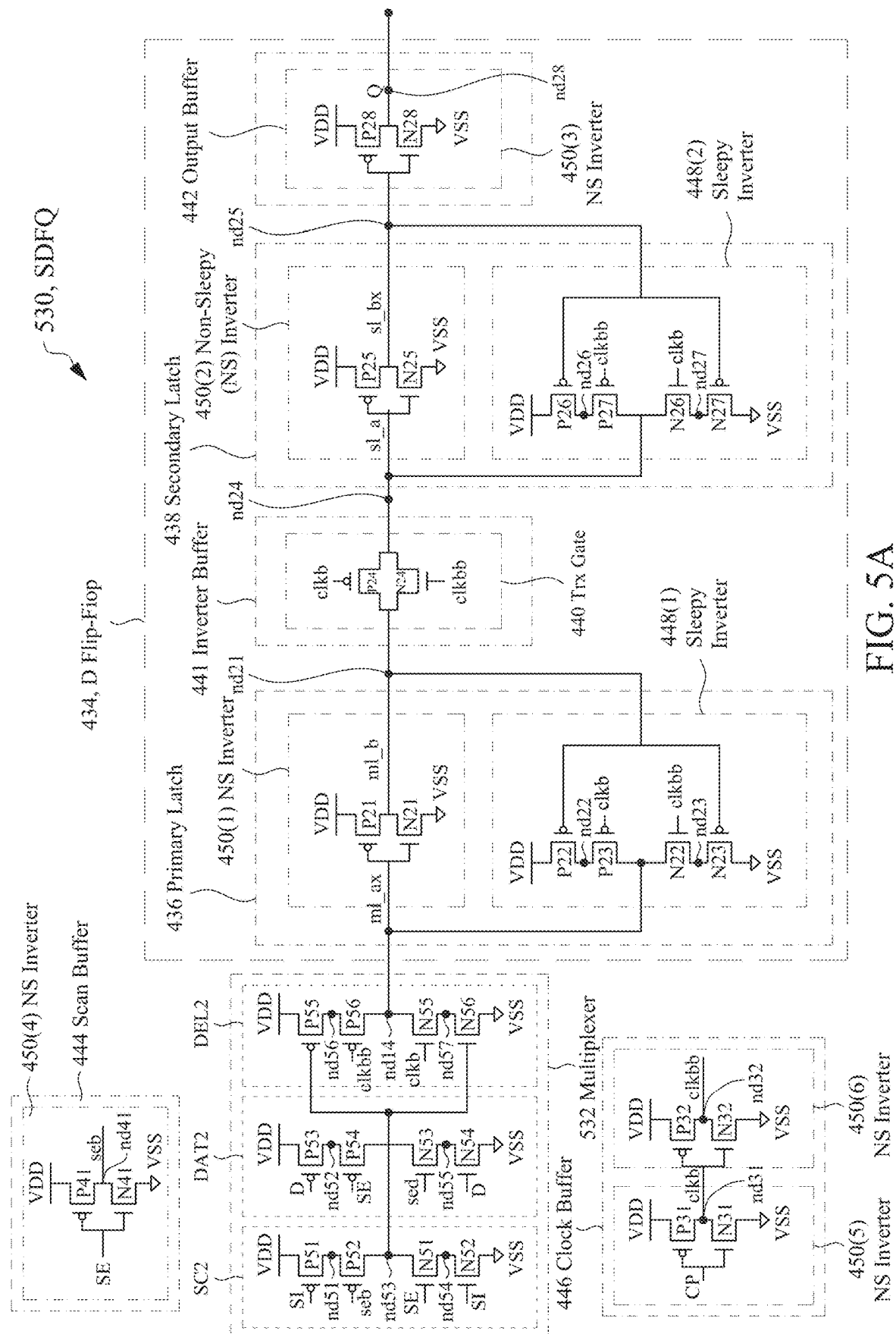
FIG. 5A is a schematic circuit diagram, in accordance with some embodiments.

FIG. 5A is a schematic circuit diagram, in accordance with some embodiments.

More particularly, FIG. 5A is a schematic circuit diagram of an SDFQ 530. SDFQ 530 is an example of how the transistors of FIGS. 1, 2, 3A-3B or the like are arranged to function as an active circuit.

FIG. 5A is a transmission-gate-based design. SDFQ 530 is an edge-triggered arrangement that is triggered on a rising edge (positive edge) of a clock signal. Variations of SDFQ 530 are triggered on the falling edge (negative edge) of the clock signal. Other variations of SDFQ 530 are double edge-triggered, i.e., are trigged by both the rising edge (positive edge) and falling edge (negative edge) of the clock signal.

In FIG. 5A, SDFQ 530 includes a multiplexer 532, D flip-flop 434, scan buffer 444, clock buffer 446. D flip-flop 434, scan buffer 444 and clock buffer 446 are the same as in SDFQ 430 described above with respect to FIG. 4A Accordingly, the discussion of D flip-flop 434, scan buffer 444 and clock buffer 446 is not repeated for the sake of brevity. Rather, discussion of SDFQ 530 will focus on multiplexer 532 which is an alternative to multiplexer 432 of FIG. 4A.

In FIG. 5A, multiplexer 532 includes transistors P51-P56 and N51-N56. Transistor P51 is connected between a node having voltage VDD and a node nd51. The gate terminal of transistor P51 receives scan input signal SI. Transistor P52 is connected between node nd51 and a node nd53. The gate terminal of transistor P52 receives signal seb. Transistor P53 is connected between a node having voltage VDD and the node nd52. The gate terminal of transistor P53 receives data input signal D. Transistor P54 is connected between node nd52 and node nd53. The gate terminal of transistor P54 receives signal SE. Transistor P55 is connected between a node having voltage VDD and the node nd56. Transistor P55 has a gate terminal that is connected to node nd53. Transistor P56 is connected between node nd56 and internal node nd14, the latter having signal m1_ax. The gate terminal of transistor P15 receives signal clkbb.

Transistor N51 is connected between node nd53 and a node nd54. The gate terminal of transistor N51 receives signal SE. Transistor N52 is connected between node nd54 and a node having voltage VSS. The gate terminal of transistor N52 receives signal SI. Transistor N53 is connected between node nd53 and a node nd55. The gate terminal of transistor N53 receives signal seb. Transistor N54 is connected between node nd55 and a node having voltage VSS. The gate terminal of transistor N54 receives data input signal D. Transistor N55 is connected between internal node nd14 and a node nd57. The gate terminal of transistor N55 receives signal clkb. Transistor N56 is connected between internal node nd57 and a node having a voltage VSS. The gate terminal of transistors N56 is connected to node nd53.

In multiplexer 532, transistors P53, P54, N53, N54 define a group of data transistors DAT2 (data group DAT2) of multiplexer 532. Data group DAT2 is used for selecting the data input signal D. In some embodiments, components of transistors P53, P54 are in AR 124P of FIG. 1, AR 224P of FIGS. 2B and 3A-3B, or the like. In some embodiments, components of transistors N53, N54 are in AR 124N of FIG. 1, AR 224N of FIGS. 2B and 3A-3B, or the like.

Transistors P51, P52, N51, N52 define a group of scan transistors SC2 (scan group SC2) of multiplexer 532. Scan group SC2 is used for selecting the scan input signal SI. In some embodiments, components of transistors P51, P52 are in AR 126P of FIG. 1, AR 226P of FIGS. 2B and 3A-3B, or the like. In some embodiments, components of transistors N51, N52 are in AR 126N of FIG. 1, AR 226N of FIGS. 2B and 3A-3B, or the like.

Transistors P55, P56, N56, N55 define a group of delay transistors DEL2 (delay group DEL2) of multiplexer 532. Delay group DEL2 is used for delaying the propagation of the selected input, namely either SI or D, through multiplexer 532. The transistors of delay group DEL2 are configured as a sleepy inverter. In some embodiments, components of transistors P55, P56 are in AR 124P of FIG. 1, AR 224P of FIGS. 2B and 3A-3B, or the like. In some embodiments, components of transistors N55, N56 are in AR 124N of FIG. 1, AR 224N of FIGS. 2B and 3A-3B, or the like.

Because the transistors of scan group SC2 of multiplexer 532 are formed in ARs 126P, 226P with the smaller channel size as compared to the transistors of data group DAT2, the transistors of scan group SC2 have a greater propagation delay as compared to the transistors of delay group DAT2. In terms of when a signal reaches internal node nd14, the greater propagation delay of the transistors in scan group SC2 is similar or equal to the propagation delay of combinational logic 201 (FIG. 2A) plus the propagation delay the transistors in data group DAT2.

Figure 5B:
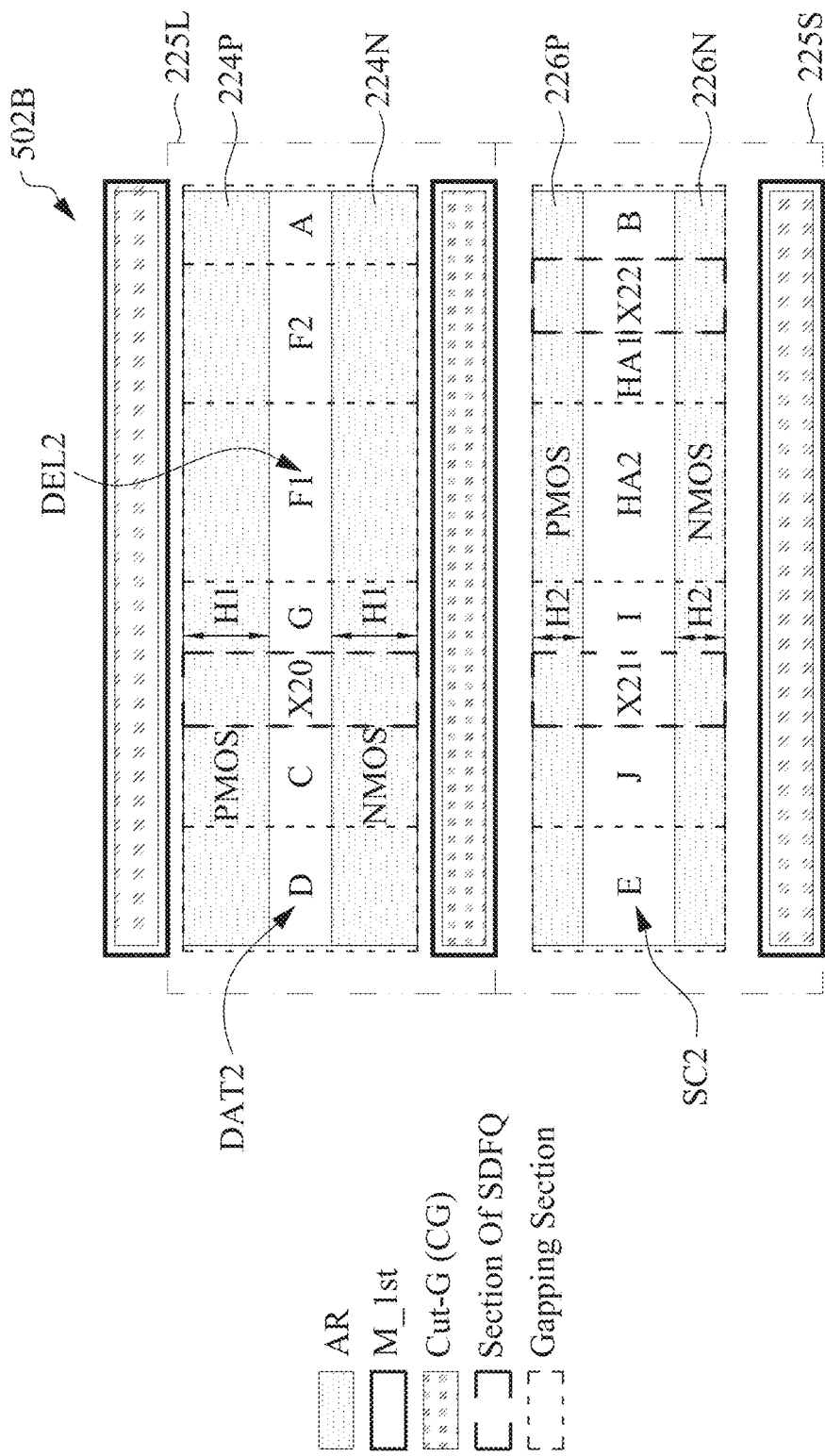
FIGS. 5B-5C are corresponding layout diagrams, in accordance with some embodiments.
Figure 5C:
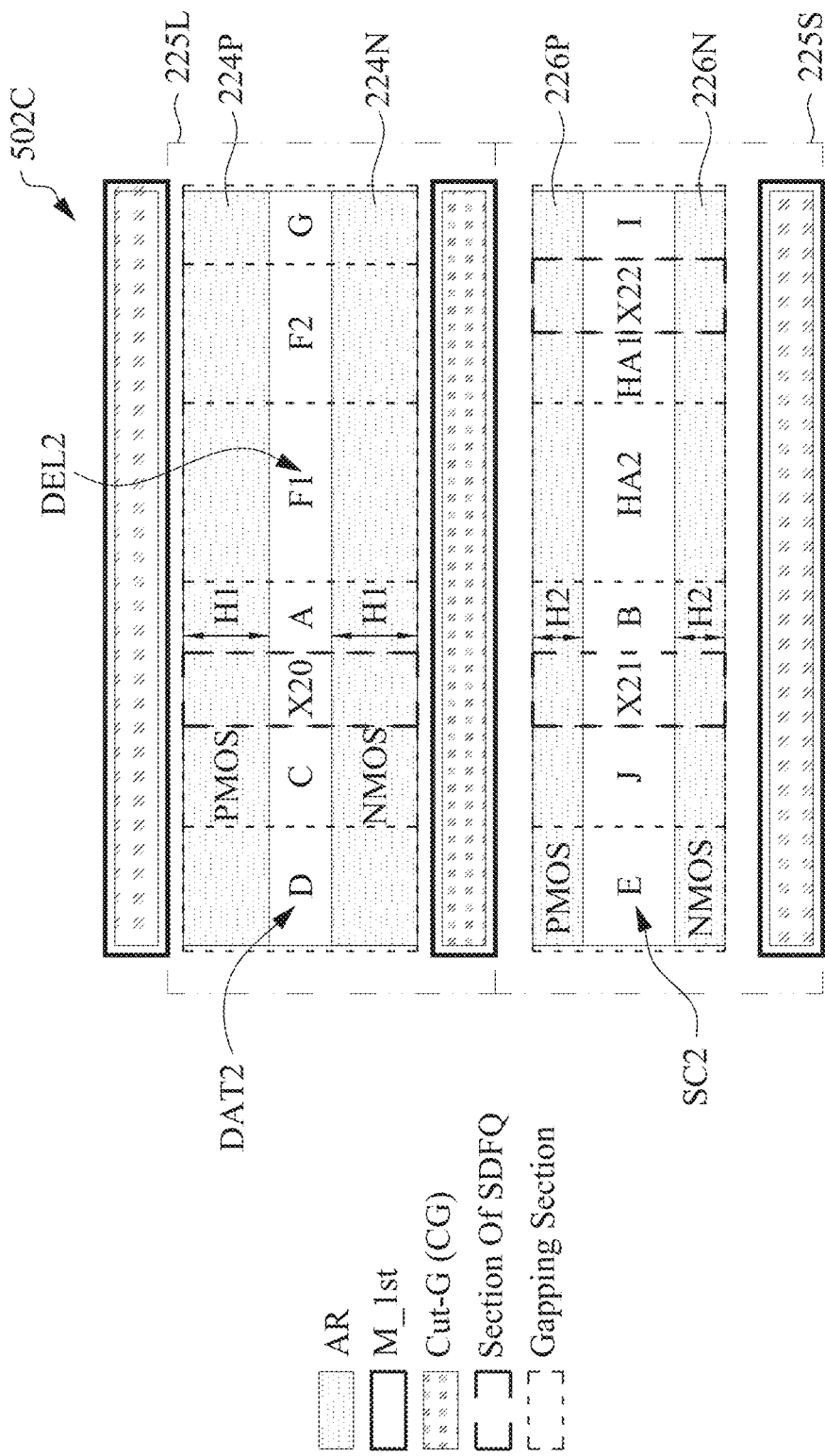

FIGS. 5B-5C are corresponding layout diagrams 502B-502C, in accordance with some embodiments.

Each of layout diagrams 502B-502C is an example of layout diagram of cell region 202 of FIG. 2B. FIGS. 5B-5C include different arrangements of the transistors of SDFQ 530 of FIG. 5A in cell region 202 of FIG. 2B. Gates 209 and cut patterns 210 are not included in FIG. 5B-5C for simplicity of illustration.

In FIGS. 5B-5C, sections A, B, C, D, E, F1, F2, G, HA1, HA2, I, J correspond to different components of SDFQ 530 as described in Table 2 below.

TABLE 2

| Component from FIG. 5A | Section |
| --- | --- |
| 450(5) NS Inverter of Clock Buffer 446 | A |
| 450(6) NS Inverter of Clock Buffer 446 | B |
| 450(4) NS Inverter of 444 Scan Buffer | C |
| DAT2 Data Transistors of 532 Multiplexer | D |
| SC2 Scan Transistors of 532 Multiplexer | E |
| DEL2 Delay Transistors of 532 Multiplexer | F1 |
| 448(1) Sleepy Inverter of Primary Latch 436 | F2 |
| 450(1) NS Inverter of Primary Latch 436 | G |
| 440 Transmission Gate of 441 Internal Buffer | HA1 |
| 448(2) Sleepy Inverter of 438 Secondary Latch | HA2 |
| 450(2) NS Inverter of 438 Secondary Latch | I |
| 450(3) NS Inverter of 442 Output Buffer | J |

Also shown in FIG. 5B-5C are gapping sections. A gapping section does not include any of the PMOS or NMOS transistors of SDFQ 530 shown in FIG. 5A. The gapping section includes 1) includes passive components of SDFQ 530 that are not shown in 5A, 2) active or passive components of other semiconductor devices that are not part of SDFQ 530, 3) dummy components, and/or 4) a spacing section with neither active, passive, or dummy components. Gapping sections are identified with the letter "X" followed by a number to specifically identify the gapping section. It should be noted that when a gapping section is between pair of any two of sections A, B, C, D, E, F1, F2, G, HAL HA2, I, J, then the pair is considered adjacent to one another with respect to the SDFQ 530 but is not abutting with respect to each other. Relative to the X-axis, gapping sections having different sizes/dimensions due to space-packing considerations which depend upon the sequence of sections in subregion 225L and the sequence of sections in subregion 225S.

In each of FIGS. 5B-5C, the PMOS transistors having components in sections A, C, D, F1, F2, and G of subregion 225L are formed in AR 224P.

The NMOS transistors having components in sections A, C, D, F1, F2, and G of subregion 225L are formed in AR 224N.

The PMOS transistors having components in sections B, E, HAL HA2, I, and J of subregion 225S are formed in AR 226P.

The NMOS transistors having components in sections B, E, HAL HA2, I, and J of subregion 225S are formed in AR 226N.

In FIG. 5B, the left-to-right sequence of the adjacent and abutting sections in subregion 225L is D:C:X20:G:F1:F2:A. In FIG. 5B, the left-to-right sequence of adjacent and abutting sections in subregion 225S is E:J:X21:LHA2:HA1:X22:B.

In FIG. 5C, the left-to-right sequence of the adjacent and abutting sections in subregion 225L is D:C:X20:A:F1:F2:G. In FIG. 5C, the left-to-right sequence of adjacent and abutting sections in subregion 225S is E:J:X21:B:HA2:HA1:X22:I. In FIG. 5C, sections A and G of subregion 225L are reversed in position as compared to the positions of sections A and G of subregion 225L in FIG. 5B, i.e., A is positioned before G in the left to right sequence in FIG. 5C versus section G being positioned before A in FIG. 5B. In FIG. 5C, sections B and I of subregion 225S are reversed in position as compared to the positions of sections B and I of subregion 225S in FIG. 5B, i.e., B is positioned before I in the left to right sequence in FIG. 5C versus section I being positioned before B in the left to right sequence in FIG. 5B.

In some embodiments, subregions 225L and subregion 225S are configured as shown in FIG. 3A with respect to layout diagrams 502B-502C of FIGS. 5B-5C. In some embodiments, subregions 225L and subregion 225S are configured as shown in FIG. 3B with respect to layout diagrams 502B-502C of FIGS. 5B-5C.

It is to be recalled that FIGS. 5B-5C are example arrangements of the transistors of SDFQ 534 of FIG. 5A, where SDFQ 534 includes the transistors of scan group SC2, data group DAT2 and delay group DEL2 of multiplexer 532, and that SDFQ 534 of FIG. 5A is an example of FF2 of FIG. 2A. According to another approach similar to FIG. 2A, the counterpart to FF2 of FIG. 2A is an SDFQ that includes transistors having a larger channel size and transistors having a smaller channel size, and the SDFQ includes a multiplexer. Regarding the transistors in the multiplexer according to the other approach, all of the transistors that would be counterparts of the transistors in scan group SC2 and data group DAT2 have the larger channel size, and all of the transistors that would be counterparts of the transistors in delay group DEL2 have the smaller channel size. Nevertheless, the other approach does not avoid the race condition. By contrast, some embodiments (e.g., FIGS. 5B-5C) of the present application advantageously avoid the race condition because the transistors of scan group SC2 have the smaller channel size (as discussed above) whereas the transistors of data group DAT2 have the larger channel size (as discussed above).

In some embodiments, configuring the transistors of scan group SC2 to have the smaller channel size is referred to as configuring scan group SC2 to be a choke, where use herein of the term choke is discussed above. As noted, the other approach configures all of the transistors in the multiplexer that would be counterparts of the transistors in delay group DEL2 to have the smaller channel size, i.e., to be a choke. As such, the other approach creates a choke that indiscriminately affects operation of the multiplexer during both scan/test operation and during non-scan/test operation, and thus the other approach fails to avoid the race condition. By contrast, configuring the transistors of scan group SC2 to have the smaller channel size as in some embodiments of the present application creates a choke which is discriminating in the effect upon operation of the multiplexer, i.e., creates a choke which achieves relatively slower propagation during scan/test operation than is achieved during non-scan/test operation, and thus avoids the race condition.

Figure 6A:
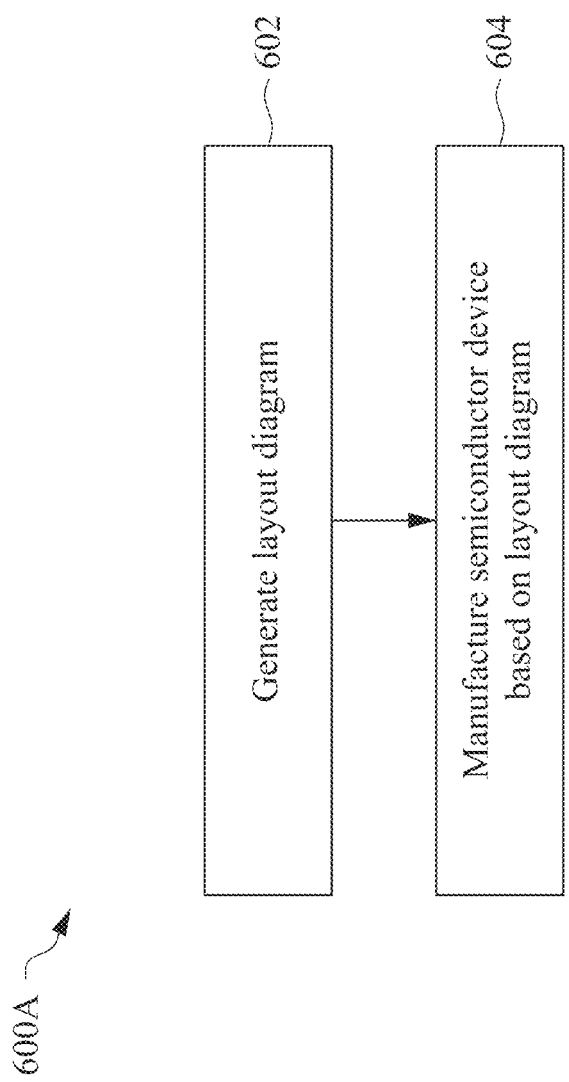
FIG. 6A is a flow diagram of a method of manufacturing a semiconductor device, in accordance with some embodiments.

FIG. 6A is a flow diagram 600A of a method of manufacturing a semiconductor device, in accordance with some embodiments.

The method of flowchart 600A is implementable, for example, using EDA system 700 (FIG. 7, discussed below) and an IC manufacturing system 800 (FIG. 8, discussed below), in accordance with some embodiments. Examples of a semiconductor device which can be manufactured according to the method of flowchart 600A include semiconductor devices of FIGS. 1, 3A-3B, 4A-4F and 5A-5C, semiconductor device 200 in FIG. 2A, semiconductor devices based on the layout diagram of cell region 202 of FIG. 2B, or the like.

In FIG. 6A, the method of flowchart 600A includes blocks 602-604. At block 602, a layout diagram is generated which, among other things, includes one or more of layout diagrams disclosed herein, or the like. Block 602 is implementable, for example, using EDA system 700 (FIG. 7, discussed below), in accordance with some embodiments. From block 602, flow proceeds to block 604.

At block 604, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 800 in FIG. 8 below.

Figure 6B:
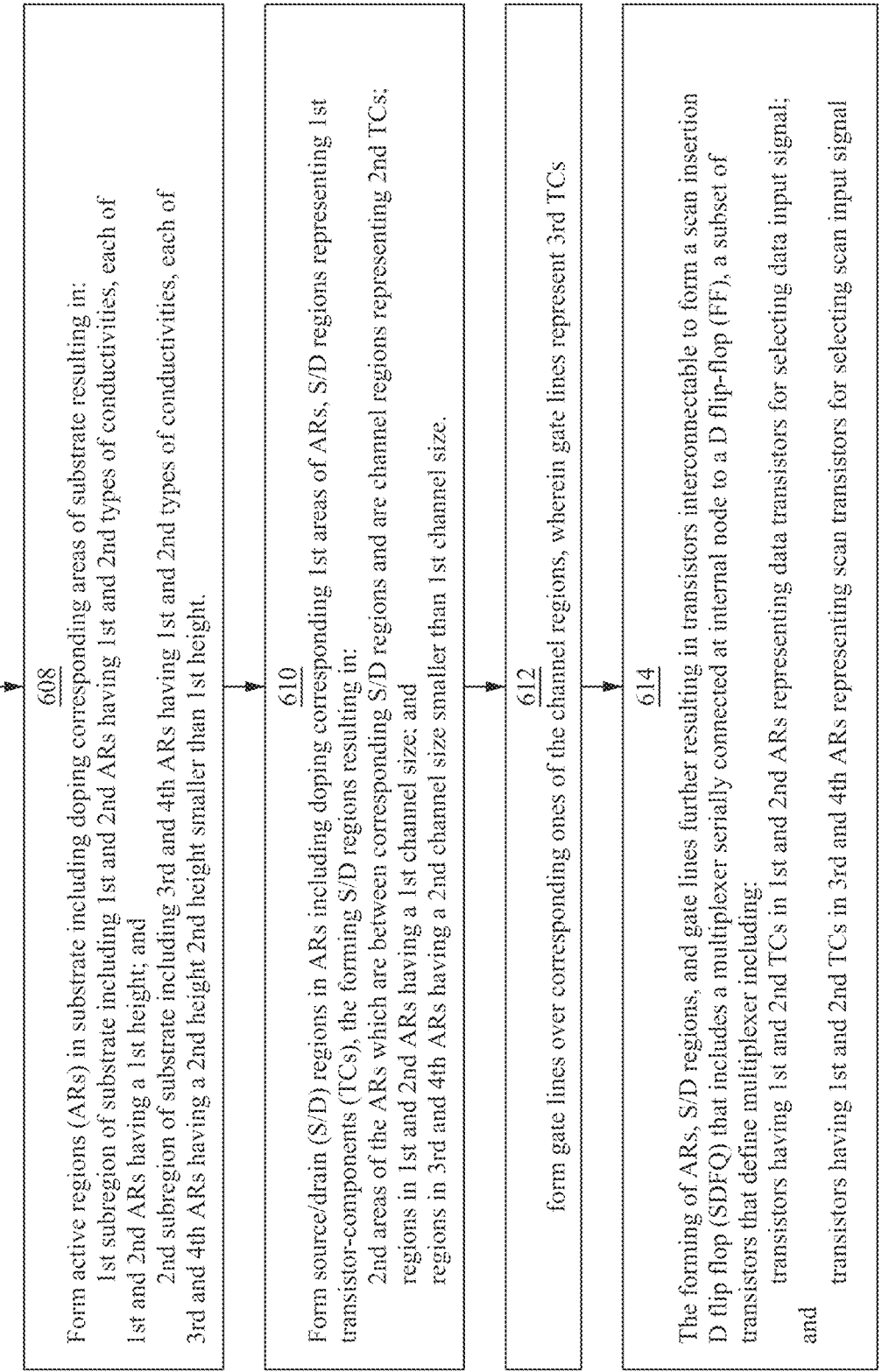
FIG. 6B is a method of fabricating a semiconductor device, in accordance with some embodiments.

FIG. 6B is a method 600B of fabricating a semiconductor device, in accordance with some embodiments.

Method 600B includes blocks 606-614. Method 600B is an example of block 602 in FIG. 6A. In FIG. 6B, flow begins at block 606.

At block 606, a substrate is formed. Examples of the substrate include substrates 101 in FIG. 1, 203 in FIG. 2B, 302 of FIGS. 3A-3B, or the like. From block 606, flow then proceeds to block 608.

At block 608, active regions (ARs) are formed including doping corresponding areas of the substrate resulting in the ARs extending a first direction; a first subregion of the substrate including first and second ones of the active regions (first and second active regions); the first active region having a first conductivity-type dopant, the second active region having a second conductivity type dopant; each of the first and second active regions having a first height with respect to a second direction, the second direction being perpendicular to the first direction; a second subregion of the substrate including third and fourth ones of the active regions (third and fourth active regions); the third active region having the first conductivity-type dopant; the fourth active region having the second conductivity-type dopant; and each of the third and fourth active regions having a second height with respect to the second direction, the second height being smaller than the first height. Examples of active regions (ARs) in the cell region include ARs 124P, 124N, 126P, 126N in FIG. 1, ARs 224P, 224N, 226P, 226N in FIG. 2B, or the like. The ARs extend in a first direction. From block 608, flow then proceeds to block 610.

Regarding block 608, an example of the first direction is a direction parallel to the X-axis, e.g., as in FIG. 1 and FIG. 2B, or the like. Examples of the first subregion include 125L in FIG. 1, 225L in FIGS. 2B, 3A-3B, 4B-4E, 5B-5C, or the like. Examples of the first and second active regions in the first subregion include ARs 124P and 124N in subregion 125L in FIG. 1, ARs 224P and 224N in subregion 225L in FIG. 2B, or the like. Examples of the first AR being doped with a first conductivity-type dopant include AR 124P in FIG. 1 and AR 224P in FIG. 2B, each of which is doped with a P-type dopant according to PFET technology, or the like. Examples of the second AR being doped with a second conductivity type dopant include AR 124N in FIG. 1 and AR 224N in FIG. 2B, each of which is doped with an N-type dopant according to NFET technology. An example of the first height with respect to the second direction (e.g., the Y-axis) for the first and second active regions is height H1 in FIGS. 2B,3A-3B, or the like.

Further regarding block 608, a second subregion in the cell region includes the third and fourth active regions. Examples of the second subregion include 125S in FIG. 1, 225S in FIGS. 2B, 3A-3B, 4B-4E, 5B-5C, or the like. Examples of the third and fourth active regions in the second subregion include ARs 126P and 126N in subregion 125S in FIG. 1, ARs 226P and 226N in subregion 225S in FIG. 2B, or the like. Examples of the third AR being doped with the first conductivity-type dopant include AR 126P in FIG. 1 and AR 226P in FIG. 2B, each of which is doped with the P-type dopant according to PFET technology, or the like. Examples of the fourth AR being doped with the second conductivity type dopant include AR 126N in FIG. 1 and AR 226N in FIG. 2B, each of which is doped with an N-type dopant according to NFET technology. An example of the second height with respect to the second direction (e.g., the Y-axis) for the third and fourth active regions is height H2 in FIGS. 2B,3A-3B, or the like. From block608, flow proceeds to block 610.

At block 610, source/drain (S/D) regions are formed in the ARs including doping corresponding first areas of the ARs, the S/D regions representing first transistor-components, the forming S/D regions resulting in: second areas of the active regions which are between the corresponding S/D regions are channel regions representing second transistor components; ones of channel regions in the first and second active regions having a first channel size; and ones of channel regions in the third and fourth active regions having a second channel size, the second channel size being smaller than first channel size.

Regarding block 610, examples of S/D regions include portions of the ARs 224P, 224N, 226P, 226N to the left and right of gates 209 in FIG. 2B, or the like. Examples of the channel regions include fins 317, 318 in FIGS. 3A-3B, or the like. The channel regions of the first active region and the second active region have a first channel size. Examples of the channel regions with the first channel size include fins 317, 318 of 224P, 224N in FIGS. 3A-3B, or the like. The channel regions of the third active region and the fourth ARs have a second channel size that is smaller than the first channel size. Examples of the channel regions with the second channel size include fins 317, 318 of 226P, 226N in FIGS. 3A-3B, or the like. From block 610, flow then proceeds to block 612.

At block 612, gate lines are formed over corresponding channel regions, wherein the gate lines represent third transistor components. Examples of the gate lines include gates 209 in FIG. 2B, or the like. From flow 612, flow then proceeds to block 614.

At block 614, the forming of ARs, the forming of S/D regions, and the forming of gate lines result in transistors that are interconnectable to form a scan insertion D flip flop (SDFQ) which includes a multiplexer serially connected at an internal node to a D flip-flop (FF). A subset of ones of the transistors that define the multiplexer include: ones of transistors having first and second transistor-components which are in the first and second ARs and which represent data transistors for selecting a data input signal; and ones of transistors having first and second transistor-components which are in the third and fourth ARs and which represent scan transistors for selecting a scan input signal. Examples of the SDFQ include SDFQ 430 in FIG. 4A, SDFQ 530 in FIG. 5A, or the like. An example of the D FF is D FF 434 in FIGS. 4A and 5A, or the like. Examples of the internal node include internal node nd14 in FIGS. 4A, and 5A, or the like. Examples of the multiplexer include multiplexer 432 in FIG. 4A, multiplexer 532 in FIG. 5A, or the like. Examples of the data transistors include the transistors in data group DAT1 in FIG. 4A, the transistors in data group DAT2 in FIG. 4B, or the like. Examples of the scan transistors include the transistors in scan group SC1 in FIG. 4A, the transistors scan group SC2 in FIG. 5A, or the like.

Figure 7:
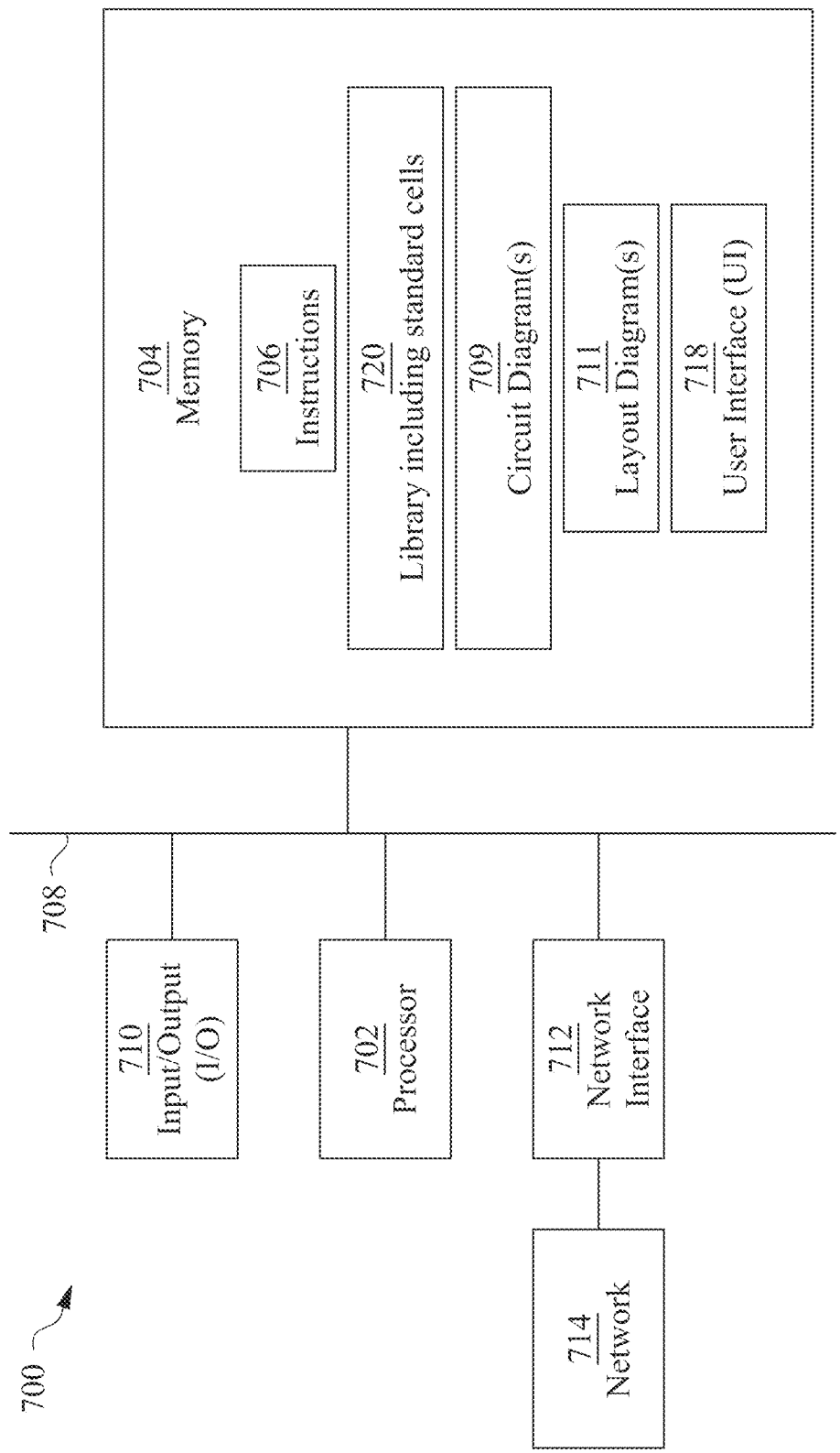
FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an APR system. In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., the methods of FIGS. 6A, 6B, and 7, in accordance with one or more embodiments (hereinafter, the noted processes and/or methods). Storage medium 704, amongst other things, stores layout diagram of cell region 202 in FIG. 2B, layout diagrams 402B-402F in FIGS. 4B-4F, layout diagrams 502B-502C in FIGS. 5A-5B, and other layout diagrams of the like within the scope of the present disclosure.

Processor 702 is electrically coupled to computer-readable storage medium 704 via a bus 708. Processor 702 is further electrically coupled to an I/O interface 710 by bus 708. A network interface 712 is further electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 further stores information which facilitates performing a portion or all of the noted processes and/or methods. In one or more embodiments, storage medium 704 stores library 720 of standard cells including such standard cells as disclosed herein, one or more circuit diagrams 709 including such circuit diagrams as disclosed herein, and one or more layout diagrams 711 including such layout diagrams as disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 further includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 718.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
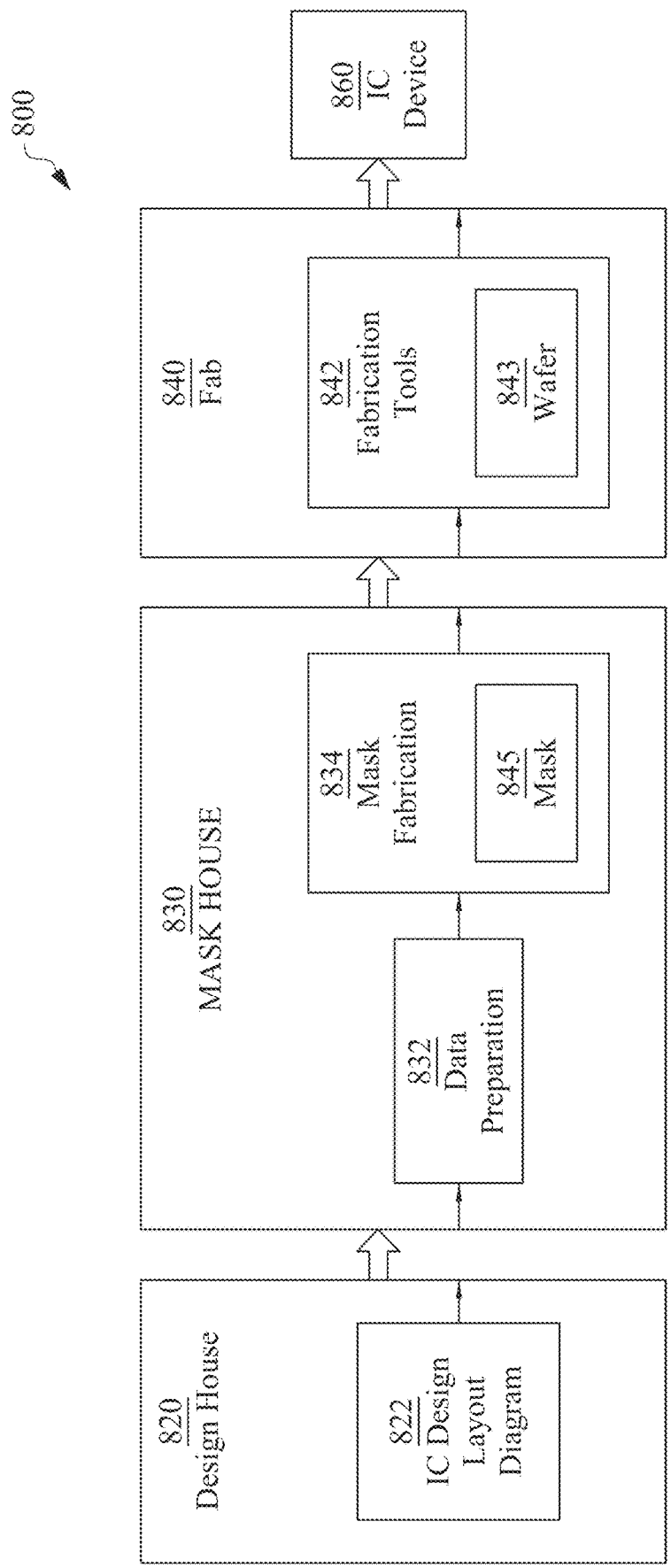
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments.

After block 602 of FIG. 6A, based on the layout, the IC manufacturing system 800 implements block 604 wherein at least one of (A) one or more semiconductor masks or (B) at least one component in a layer of an inchoate semiconductor integrated circuit is fabricated using manufacturing system 800. In some embodiments, blocks 606-614 are implemented by the IC manufacturing system 800 in order to perform block 604.

In FIG. 8, IC manufacturing system 800 includes entities, such as a design house 820, a mask house 830, and an IC manufacturer/fabricator ("fab") 840, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 820, mask house 830, and IC fab 840 is owned by a single larger company. In some embodiments, two or more of design house 820, mask house 830, and IC fab 840 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 is expressed in a GDSII file format or DFII file format.

Mask house 830 includes data preparation 832 and mask fabrication 834. Mask house 830 uses IC design layout 822 to manufacture one or more masks to be used for fabricating the various layers of IC device 860 according to IC design layout 822. Mask house 830 performs mask data preparation 832, where IC design layout 822 is translated into a representative data file ("RDF"). Mask data preparation 832 supplies the RDF to mask fabrication 834. Mask fabrication 834 includes a mask writer. A mask writer converts the RDF to an image on a substrate, such as a mask (reticle) or a semiconductor wafer. The design layout is manipulated by mask data preparation 832 to comply with particular characteristics of the mask writer and/or requirements of IC fab 840. In FIG. 8, mask data preparation 832, mask fabrication 834, and mask 835 are illustrated as separate elements. In some embodiments, mask data preparation 832 and mask fabrication 834 are collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 834, which may undo part of the modifications performed by OPC in order to meet mask creation rules.

In some embodiments, mask data preparation 832 includes lithography process checking (LPC) that simulates processing that will be implemented by IC fab 840 to fabricate IC device 860. LPC simulates this processing based on IC design layout 822 to fabricate a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 822.

The above description of mask data preparation 832 has been simplified for the purposes of clarity. In some embodiments, data preparation 832 includes additional features such as a logic operation (LOP) to modify the IC design layout according to manufacturing rules. Additionally, the processes applied to IC design layout 822 during data preparation 832 may be executed in a variety of different orders.

After mask data preparation 832 and during mask fabrication 834, a mask 835 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 834 is used in a variety of processes. For example, such a mask(s) is used in an ion implantation process to form various doped regions in the semiconductor wafer, in an etching process to form various etching regions in the semiconductor wafer, and/or in other suitable processes.

IC fab 840 is an IC fabrication business that includes one or more manufacturing facilities for the fabrication of a variety of different IC products. In some embodiments, IC fab 840 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 840 uses the mask (or masks) fabricated by mask house 830 to fabricate IC device 860 using fabrication tools 852. Thus, IC fab 840 at least indirectly uses IC design layout 822 to fabricate IC device 860. In some embodiments, a semiconductor wafer 843 is fabricated by IC fab 840 using the mask (or masks) to form IC device 860. Semiconductor wafer 843 includes a silicon substrate or other proper substrate having material layers formed thereon. Semiconductor wafer 843 further includes one or more of various doped regions, dielectric features, multi-level interconnects, and the like (formed at subsequent manufacturing steps).

In some embodiments, a semiconductor device, includes: a cell region including active regions that extend in a first direction and having components of transistors formed therein; the transistors of the cell region being arranged to function as a scan insertion D flip flop (SDFQ) that includes a multiplexer serially connected at an internal node to a D flip-flop (FF); and the transistors including: data transistors of the multiplexer for selecting a data input signal, the data transistors having a first channel configuration with a first channel size; and scan transistors of the multiplexer for selecting a scan input signal, the scan transistors having a second channel configuration with a second channel size, the second channel size being smaller than the first channel size. In some embodiments, the active regions include corresponding fins that extend in the first direction; the transistors of the cell region are fin-type field effect transistors (finFETs); the first channel size of the data transistors is proportional to a first number of fins included therein; the second channel size of the scan transistors is proportional to a second number of fins included therein; and the second number of fins is fewer than the first number of fins. In some embodiments, the active regions including first active regions and second active regions; the cell region includes a first subregion and a second subregion; the first subregion includes the first active regions; the second subregion includes the second active regions; each of the first active regions have a first height relative to a second direction, the second direction being perpendicular to the first direction; each of the second active regions have a second height relative to the first direction, the second height being less than the first height; the data transistors are formed in the first active regions such that the first channel size of the data transistors is represented by the first height; the scan transistors are formed in the second active regions such that the second channel size of the data transistors is represented by the second channel height. In some embodiments, the first subregion and the second subregion are aligned relative to the first direction and displaced relative to the second direction. In some embodiments, the semiconductor device further includes: combinational logic that generates the data input signal; and wherein: a first propagation delay is defined as a propagation delay of the combinational logic plus a propagation delay of the data input signal through the multiplexer; a second propagation delay is defined as a propagation delay of the scan input signal through the multiplexer; and the second channel size of the scan transistors is sufficiently smaller than the first channel size of the data transistors such that the second propagation delay is approximately equal to the first propagation delay. In some embodiments, the transistors further include delay transistors of the multiplexer; and the delay transistors have the first channel configuration with the first channel size. In some embodiments, the scan transistors include a first positive-channel metal-oxide semiconductor field effect (PMOS) transistor, a second PMOS transistor, a first negative-channel metal-oxide semiconductor field effect (NMOS) transistor, and a second NMOS transistor; the data transistors include a third PMOS transistor, a fourth PMOS transistor, a third NMOS transistor, and a fourth NMOS transistor; the delay transistors include a fifth PMOS transistor and a fifth NMOS transistor; the first PMOS transistor and the second PMOS transistor are serially connected between a first node and a second node; the third PMOS transistor and the fourth PMOS transistor are serially connected between a third node and the second node; the fifth PMOS transistor is connected between the second node and the internal node; the fifth NMOS transistor is connected between the internal node and a fourth node; the first NMOS transistor and the second NMOS transistor are serially connected between the fourth node and a fifth node; the third NMOS transistor and the fourth NMOS transistor are serially connected between the fourth node and a sixth node. In some embodiments, the first node is configured to receive a first reference voltage; gates of the first PMOS and second NMOS transistors are configured to receive the scan input signal; gates of the second PMOS and third NMOS transistors are configured to receive an inverted scan-enable signal; gates of the fourth PMOS and first NMOS transistors are configured to receive a non-inverted scan-enable signal; the third node is configured to receive the first reference voltage; gates of the third PMOS and fourth NMOS transistors are configured to receive the data input signal; a gate of the fifth PMOS transistor is configured to receive an non-inverted clock signal; the fifth node is configured to receive a second reference voltage, wherein the second reference voltage is lower than the first reference voltage; a gate of the fifth NMOS transistor is configured to receive an inverted clock signal; and the sixth node is configured to receive the second reference voltage. In some embodiments, the scan transistors include a first positive-channel metal-oxide semiconductor field effect transistor (PMOS), a second PMOS, a first negative-channel metal-oxide semiconductor field effect transistor (NMOS), and a second NMOS; the data transistors include a third PMOS, a fourth PMOS, a third NMOS, and a fourth NMOS; the delay transistors include a fifth PMOS, a sixth PMOS, and a fifth NMOS, and a sixth NMOS; the first PMOS and the second PMOS are serially connected between a first node and a second node; the third PMOS and the fourth PMOS are serially connected between a third node and the second node; the fifth PMOS and the sixth PMOS are serially connected between a fourth node and the internal node; the first NMOS and the second NMOS are serially connected between the second node and a fifth node; the third NMOS and the fourth NMOS are serially connected between the second node and a sixth node; and the fifth NMOS and the sixth NMOS are serially connected between the internal node and a seventh node. In some embodiments, the first node, the third node, and the fourth node are configured to receive a first reference voltage; the fifth node, the sixth node, and the seventh node are configured to receive a second reference voltage, wherein the second reference voltage is lower than the first reference voltage; a gate of the first PMOS is configured to receive the scan input signal; a gate of the second PMOS is configured to receive an inverted scan-enable signal; a gate of the first NMOS is configured to receive a non-inverted scan-enable signal; a gate of the second NMOS is configured to receive the scan input signal; a gate of the third PMOS is configured to receive the data input signal; a gate of the fourth PMOS is configured to receive the non-inverted scan-enable signal; a gate of the third NMOS is configured to receive the data input signal; a gate of the fourth NMOS is configured to receive the non-inverted scan-enable signal; a gate of the fifth PMOS is connected to the second node; a gate of the sixth PMOS is configured to receive a non-inverted clock signal; a gate of the fifth NMOS is configured to receive an inverted clock signal; and a gate of the sixth NMOS is connected to the second node.

In some embodiments, a semiconductor device, includes: a cell region including first, second, third and fourth active regions that extend in a first direction and correspondingly having components of first transistors, second transistors, third transistors and fourth transistors formed therein; the active regions being rectangular; the cell region including a first subregion, the first subregion including the first and second active regions; the first active region being doped with a first conductivity-type dopant; the second active region being doped with a second conductivity-type dopant; the first active region and the second active region having a first height with respect to a second direction, the second direction being perpendicular to the first direction; the cell region further including a second subregion, the second subregion including the third and fourth active regions; the third active region being doped with the first conductivity-type; the fourth active region is of the second conductivity-type dopant; the third active region and the fourth active region having a second height with respect to the second direction, the second height being smaller than the first height; and the transistors of the cell region being arranged to function as a scan insertion D flip flop (SDFQ) that includes a multiplexer serially connected at an internal node to a D flip-flop (FF); the multiplexer including: corresponding ones of the first transistors and the second transistors as data transistors for selecting a data input signal; and corresponding ones of the third transistors and the fourth transistors as scan transistors for selecting a scan input signal. In some embodiments, the D flip-flop includes: a primary latch that includes a first sleepy inverter and a first non-sleepy inverter, a first subset of the first transistors and the second transistors being configured as the first sleepy inverter and a second subset of the first transistors and the second transistors being configured as the first non-sleepy inverter; the SDFQ further includes: a clock buffer that includes a second non-sleepy inverter, a third subset of the first transistors and the second transistors being configured as the second non-sleepy inverter; the D flip-flop further includes: an output buffer, a fourth subset of the first transistors and the second transistors being configured as the output buffer; the first sleepy inverter is adjacent to the second non-sleepy inverter; and the first non-sleepy inverter is adjacent to the output buffer. In some embodiments, the D flip-flop includes: a primary latch that includes a sleepy inverter and a first non-sleepy inverter, a first subset of the first transistors and the second transistors being configured as the sleepy inverter and a second subset of the first transistors and the second transistors being configured as the first non-sleepy inverter; a clock buffer that includes a second non-sleepy inverter, a third subset of the first transistors and the second transistors being configured as the second non-sleepy inverter; an output buffer, a fourth subset of the first transistors and the second transistors being configured as the output buffer; the sleepy inverter is adjacent to the first non-sleepy inverter; and the second non-sleepy inverter is adjacent to the output buffer. In some embodiments, the D flip-flop includes: a primary latch that includes a sleepy inverter and a first non-sleepy inverter, a first subset of the first transistors and the second transistors being configured as the sleepy inverter and a second subset of the first transistors and the second transistors being configured as the first non-sleepy inverter; a clock buffer that includes a second non-sleepy inverter, a third subset of the first transistors and the second transistors being configured as the second non-sleepy inverter; an output buffer, a first subset of the third transistors and the fourth transistors being configured as the output buffer; the sleepy inverter is adjacent to the second non-sleepy inverter; and the second non-sleepy inverter is positioned between the sleepy inverter and the first non-sleepy inverter. In some embodiments, the D flip-flop includes: a primary latch that includes a sleepy inverter and a first non-sleepy inverter, a first subset of the first transistors and the second transistors being configured as the sleepy inverter and a second subset of the first transistors and the second transistors being configured as the first non-sleepy inverter; a clock buffer that includes a second non-sleepy inverter, a third subset of the first transistors and the second transistors being configured as the second non-sleepy inverter; an output buffer, a first subset of the third transistors and the fourth transistors being configured as the output buffer; the sleepy inverter is adjacent to the first non-sleepy inverter; and the first non-sleepy inverter is positioned between the sleepy inverter and the second non-sleepy inverter. In some embodiments, the D flip-flop includes: a primary latch that includes a sleepy inverter and a first non-sleepy inverter, a first subset of the first transistors and the second transistors being configured as the sleepy inverter and a second subset of the first transistors and the second transistors being configured as the first non-sleepy inverter; a clock buffer that includes a second non-sleepy inverter, a first subset of the third transistors and the fourth transistors being configured as the second non-sleepy inverter; an output buffer, a third subset of the first transistors and the second transistors being configured as the output buffer; the sleepy inverter is adjacent to the first non-sleepy inverter; and the first non-sleepy inverter is positioned between the sleepy inverter and the output buffer. In some embodiments, the D flip-flop includes: a primary latch that includes a first sleepy inverter and a first non-sleepy inverter, a first subset of the first transistors and the second transistors being configured as the first sleepy inverter and a second subset of the first transistors and the second transistors being configured as the first non-sleepy inverter, the first transistors and the second transistors including delay transistors of the multiplexer; a secondary latch that includes a second sleepy inverter and a second non-sleepy inverter, a first subset of the third transistors and the fourth transistors that being configured as the second sleepy inverter and a second subset of the third transistors and the fourth transistors being configured as the second non-sleepy inverter; a clock buffer that includes a third non-sleepy inverter and a fourth non-sleepy inverter connected in series, a third subset of the first transistors and the second transistors being configured as the third non-sleepy inverter and a third subset of the third transistors and the fourth transistors being configured as the fourth non-sleepy inverter; an internal buffer coupled between the primary latch and the secondary latch, wherein a fourth subset of the third transistors and the fourth transistors being configured as the internal buffer; the first non-sleepy inverter is adjacent to the delay transistors, the delay transistors are adjacent to the first sleepy inverter, and the first sleepy inverter is adjacent to the third non-sleepy inverter; and the second non-sleepy inverter is adjacent to the second non-sleepy inverter, the second non-sleepy inverter is adjacent to transmission gate, and the internal buffer is adjacent to the fourth non-sleepy inverter. In some embodiments, the D flip-flop includes: a primary latch that includes a first sleepy inverter and a first non-sleepy inverter, a first subset of the first transistors and the second transistors being configured as the first sleepy inverter and a second subset of the first transistors and the second transistors being configured as the first non-sleepy inverter, the first transistors and the second transistors including delay transistors of the multiplexer; a secondary latch that includes a second sleepy inverter and a second non-sleepy inverter, a first subset of the third transistors and the fourth transistors being configured as the second sleepy inverter and a second subset of the third transistors and the fourth transistors are configured as the second non-sleepy inverter; a clock buffer that includes a third non-sleepy inverter and a fourth non-sleepy inverter connected in series, a third subset of the first transistors and the second transistors being configured as the third non-sleepy inverter and a third subset of the third transistors and the fourth transistors being configured as the fourth non-sleepy inverter; an internal buffer coupled between the primary latch and the secondary latch, wherein a fourth subset of the third transistors and the fourth transistors being configured as the internal buffer; the third non-sleepy inverter is adjacent to the delay transistors, the delay transistors are adjacent to the first sleepy inverter, and the first sleepy inverter is adjacent to the first non-sleepy inverter; and the fourth non-sleepy inverter is adjacent to the second non-sleepy inverter, the second non-sleepy inverter is adjacent to transmission gate, and the internal buffer is adjacent to the second non-sleepy inverter.

In some embodiments, a method of forming a semiconductor device, the method includes: forming a substrate; forming active regions (ARs) in the substrate including doping corresponding areas of the substrate resulting in the active regions extending in a first direction, a first subregion of the substrate including first and second ones of the active regions (first and second active regions), the first active region having a first conductivity-type dopant, the second active region having a second conductivity-type dopant, each of the first and second active regions having a first height with respect to a second direction, the second direction being perpendicular to the first direction, a second subregion of the substrate including third and fourth ones of the active regions (third and fourth active regions), the third active region having the first conductivity-type, the fourth active region having the second conductivity-type dopant; and each of the third and fourth active regions having a second height with respect to the second direction, the second height being smaller than the first height; forming source/drain (S/D) regions in the ARs including doping corresponding first areas of the active regions, the S/D regions representing first transistor-components, the forming S/D regions resulting in second areas of the active regions which are between corresponding S/D regions are channel regions representing second transistor-components, ones of the channel regions in the first and second active regions having a first channel size, and ones of the channel regions in the third and fourth active regions a second channel size, the second channel size being smaller than the first channel size; and forming gate lines over corresponding ones of the channel regions, the gate lines representing third transistor-components; and the forming active regions, the forming S/D regions and the forming gate lines further resulting in transistors which are configured to define a scan insertion D flip flop (SDFQ) that includes a multiplexer serially connected at an internal node to a D flip-flop (FF), a subset of ones of the transistors that define the multiplexer including ones of the transistors having first and second transistor-components which are in the first and second active regions and which represent data transistors for selecting a data input signal, and ones of the transistors having first and second transistor-components which are in the third and fourth active regions and which represent scan transistors for selecting a scan input signal.

In some embodiments, the forming active regions further results in the first subregion and the second subregion being aligned relative to the first direction and displaced relative to the second direction.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device, comprising:
a cell region including active regions that extend in a first direction and having components of transistors formed therein;
the transistors of the cell region being arranged to function as a scan insertion D flip flop (SDFQ) that includes a multiplexer serially connected at an internal node to a D flip-flop (FF); and
the transistors including:
data transistors of the multiplexer for selecting a data input signal, the data transistors having a first channel configuration with a first channel size; and
scan transistors of the multiplexer for selecting a scan input signal, the scan transistors having a second channel configuration with a second channel size, the second channel size being smaller than the first channel size.

2. The semiconductor device of claim 1, wherein:
the active regions include corresponding fins that extend in the first direction;
the transistors of the cell region are fin-type field effect transistors (fin-FETs);
the first channel size of the data transistors is proportional to a first number of fins included therein;
the second channel size of the scan transistors is proportional to a second number of fins included therein; and
the second number of fins is fewer than the first number of fins.

3. The semiconductor device of claim 1, wherein:
the active regions including first active regions and second active regions;
the cell region includes a first subregion and a second subregion;
the first subregion includes the first active regions;
the second subregion includes the second active regions;
each of the first active regions have a first height relative to a second direction, the second direction being perpendicular to the first direction;
each of the second active regions have a second height relative to the second direction, the second height being less than the first height;
the data transistors are formed in the first active regions such that the first channel size of the data transistors is represented by the first height; and the scan transistors are formed in the second active regions such that the second channel size of the scan transistors is represented by the second height.

4. The semiconductor device of claim 3, wherein the first subregion and the second subregion are aligned relative to the first direction and displaced relative to the second direction.

5. The semiconductor device of claim 1, further comprising:
combinational logic that generates the data input signal; and
wherein:
a first propagation delay is defined as a propagation delay of the combinational logic plus a propagation delay of the data input signal through the multiplexer;
a second propagation delay is defined as a propagation delay of the scan input signal through the multiplexer; and
the second channel size of the scan transistors is sufficiently smaller than the first channel size of the data transistors such that the second propagation delay is approximately equal to the first propagation delay.

6. The semiconductor device of claim 1, wherein:
the transistors further include delay transistors of the multiplexer; and
the delay transistors have the first channel configuration with the first channel size.

7. The semiconductor device of claim 6, wherein:
the scan transistors include a first positive-channel metal-oxide semiconductor field effect (PMOS) transistor, a second PMOS transistor, a first negative-channel metal-oxide semiconductor field effect (NMOS) transistor, and a second NMOS transistor;
the data transistors include a third PMOS transistor, a fourth PMOS transistor, a third NMOS transistor, and a fourth NMOS transistor;
the delay transistors include a fifth PMOS transistor and a fifth NMOS transistor;
the first PMOS transistor and the second PMOS transistor are serially connected between a first node and a second node;
the third PMOS transistor and the fourth PMOS transistor are serially connected between a third node and the second node;
the fifth PMOS transistor is connected between the second node and the internal node;
the fifth NMOS transistor is connected between the internal node and a fourth node;
the first NMOS transistor and the second NMOS transistor are serially connected between the fourth node and a fifth node; and
the third NMOS transistor and the fourth NMOS transistor are serially connected between the fourth node and a sixth node.

8. The semiconductor device of claim 7, wherein:
the first node is configured to receive a first reference voltage;
gates of the first PMOS and second NMOS transistors are configured to receive the scan input signal;
gates of the second PMOS and third NMOS transistors are configured to receive an inverted scan-enable signal;
gates of the fourth PMOS and first NMOS transistors are configured to receive a non-inverted scan-enable signal;

the third node is configured to receive the first reference voltage;
gates of the third PMOS and fourth NMOS transistors are configured to receive the data input signal;
a gate of the fifth PMOS transistor is configured to receive a non-inverted clock signal;
the fifth node is configured to receive a second reference voltage, wherein the second reference voltage is lower than the first reference voltage;
a gate of the fifth NMOS transistor is configured to receive an inverted clock signal; and
the sixth node is configured to receive the second reference voltage.

9. The semiconductor device of claim 6, wherein:
the scan transistors include a first positive-channel metal-oxide semiconductor field effect (PMOS) transistor, a second PMOS transistor, a first negative-channel metal-oxide semiconductor field effect (NMOS) transistor, and a second NMOS transistor;
the data transistors include a third PMOS transistor, a fourth PMOS transistor, a third NMOS transistor, and a fourth NMOS transistor;
the delay transistors include a fifth PMOS transistor, a sixth PMOS transistor, and a fifth NMOS transistor, and a sixth NMOS transistor;
the first PMOS transistor and the second PMOS transistor are serially connected between a first node and a second node;
the third PMOS transistor and the fourth PMOS transistor are serially connected between a third node and the second node;
the fifth PMOS transistor and the sixth PMOS transistor are serially connected between a fourth node and the internal node;
the first NMOS transistor and the second NMOS transistor are serially connected between the second node and a fifth node;
the third NMOS transistor and the fourth NMOS transistor are serially connected between the second node and a sixth node; and
the fifth NMOS transistor and the sixth NMOS transistor are serially connected between the internal node and a seventh node.

10. The semiconductor device of claim 9, wherein:
the first node, the third node, and the fourth node are configured to receive a first reference voltage;
the fifth node, the sixth node, and the seventh node are configured to receive a second reference voltage, wherein the second reference voltage is lower than the first reference voltage;
a gate of the first PMOS transistor is configured to receive the scan input signal;
a gate of the second PMOS transistor is configured to receive an inverted scan-enable signal;
a gate of the first NMOS transistor is configured to receive a non-inverted scan-enable signal;
a gate of the second NMOS transistor is configured to receive the scan input signal;
a gate of the third PMOS transistor is configured to receive the data input signal;
a gate of the fourth PMOS transistor is configured to receive the non-inverted scan-enable signal;
a gate of the third NMOS transistor is configured to receive the inverted scan-enable signal;
a gate of the fourth NMOS transistor is configured to receive the data input signal;

a gate of the fifth PMOS transistor is connected to the second node;
a gate of the sixth PMOS transistor is configured to receive a non-inverted clock signal;
a gate of the fifth NMOS transistor is configured to receive an inverted clock signal; and
a gate of the sixth NMOS transistor is connected to the second node.

11. A semiconductor device, comprising:
a cell region including first, second, third and fourth active regions that extend in a first direction and correspondingly having components of first transistors, second transistors, third transistors and fourth transistors formed therein;
the active regions being rectangular;
the cell region including a first subregion, the first subregion including the first and second active regions;
the first active region being doped with a first conductivity-type dopant;
the second active region being doped with a second conductivity-type dopant;
the first active region and the second active region having a first height with respect to a second direction, the second direction being perpendicular to the first direction;
the cell region further including a second subregion, second subregion including the third and fourth active regions;
the third active region being doped with the first conductivity-type dopant;
the fourth active region being doped with the second conductivity-type dopant;
the third active region and the fourth active region having a second height with respect to the second direction, the second height being smaller than the first height; and
the transistors of the cell region being arranged to function as a scan insertion D flip flop (SDFQ) that includes a multiplexer serially connected at an internal node to a D flip-flop (FF); the multiplexer including:
corresponding ones of the first transistors and the second transistors as data transistors for selecting a data input signal; and
corresponding ones of the third transistors and the fourth transistors as scan transistors for selecting a scan input signal.

12. The semiconductor device of claim 11, wherein:
the D flip-flop includes:
a primary latch that includes a first sleepy inverter and a first non-sleepy inverter, a first subset of the first transistors and the second transistors being configured as the first sleepy inverter and a second subset of the first transistors and the second transistors being configured as the first non-sleepy inverter;
the SDFQ further includes:
a clock buffer that includes a second non-sleepy inverter, a third subset of the first transistors and the second transistors being configured as the second non-sleepy inverter;
the D flip-flop further includes:
an output buffer, a fourth subset of the first transistors and the second transistors being configured as the output buffer;
the first sleepy inverter is adjacent to the second non-sleepy inverter; and
the first non-sleepy inverter is adjacent to the output buffer.

13. The semiconductor device of claim 11, wherein: the D flip-flop includes:
a primary latch that includes a sleepy inverter and a first non-sleepy inverter, a first subset of the first transistors and the second transistors being configured as the sleepy inverter and a second subset of the first transistors and the second transistors being configured as the first non-sleepy inverter;
the SDFQ further includes:
a clock buffer that includes a second non-sleepy inverter, a third subset of the first transistors and the second transistors being configured as the second non-sleepy inverter;
the D flip-flop further includes:
an output buffer, a fourth subset of the first transistors and the second transistors being configured as the output buffer;
the sleepy inverter is adjacent to the first non-sleepy inverter; and
the second non-sleepy inverter is adjacent to the output buffer.

14. The semiconductor device of claim 11, wherein:
the D flip-flop includes:
a primary latch that includes a sleepy inverter and a first non-sleepy inverter, a first subset of the first transistors and the second transistors being configured as the sleepy inverter and a second subset of the first transistors and the second transistors being configured as the first non-sleepy inverter;
the SDFQ further includes:
a clock buffer that includes a second non-sleepy inverter, a third subset of the first transistors and the second transistors being configured as the second non-sleepy inverter;
the D flip-flop includes:
an output buffer, a first subset of the third transistors and the fourth transistors being configured as the output buffer;
the sleepy inverter is adjacent to the second non-sleepy inverter; and
the second non-sleepy inverter is positioned between the sleepy inverter and the first non-sleepy inverter.

15. The semiconductor device of claim 11, wherein:
the D flip-flop includes:
a primary latch that includes a sleepy inverter and a first non-sleepy inverter, a first subset of the first transistors and the second transistors being configured as the sleepy inverter and a second subset of the first transistors and the second transistors being configured as the first non-sleepy inverter;
the SDFQ further includes:
a clock buffer that includes a second non-sleepy inverter, a third subset of the first transistors and the second transistors being configured as the second non-sleepy inverter;
the D flip-flop further includes:
an output buffer, a first subset of the third transistors and the fourth transistors being configured as the output buffer;
the sleepy inverter is adjacent to the first non-sleepy inverter; and
the first non-sleepy inverter is positioned between the sleepy inverter and the second non-sleepy inverter.

16. The semiconductor device of claim 11, wherein:
the D flip-flop includes:
a primary latch that includes a sleepy inverter and a first non-sleepy inverter, a first subset of the first transistors and the second transistors being configured as the sleepy inverter and a second subset of the first transistors and the second transistors being configured as the first non-sleepy inverter;
the SDFQ further includes:
  a clock buffer that includes a second non-sleepy inverter, a first subset of the third transistors and the fourth transistors being configured as the second non-sleepy inverter;
the D flip-flop includes:
  an output buffer, a third subset of the first transistors and the second transistors being configured as the output buffer;
the sleepy inverter is adjacent to the first non-sleepy inverter; and
the first non-sleepy inverter is positioned between the sleepy inverter and the output buffer.

17. The semiconductor device of claim 11, wherein:
the D flip-flop includes:
  a primary latch that includes a first sleepy inverter and a first non-sleepy inverter, a first subset of the first transistors and the second transistors being configured as the first sleepy inverter and a second subset of the first transistors and the second transistors being configured as the first non-sleepy inverter, the first transistors and the second transistors including delay transistors of the multiplexer; and
  a secondary latch that includes a second sleepy inverter and a second non-sleepy inverter, a first subset of the third transistors and the fourth transistors that being configured as the second sleepy inverter and a second subset of the third transistors and the fourth transistors being configured as the second non-sleepy inverter;
the SDFQ further includes:
  a clock buffer that includes a third non-sleepy inverter and a fourth non-sleepy inverter connected in series, a third subset of the first transistors and the second transistors being configured as the third non-sleepy inverter and a third subset of the third transistors and the fourth transistors being configured as the fourth non-sleepy inverter;
the D flip-flop includes:
  an internal buffer coupled between the primary latch and the secondary latch, wherein a fourth subset of the third transistors and the fourth transistors being configured as the internal buffer;
the first non-sleepy inverter is adjacent to the delay transistors, the delay transistors are adjacent to the first sleepy inverter, and the first sleepy inverter is adjacent to the third non-sleepy inverter; and
the second non-sleepy inverter is adjacent to the second sleepy inverter, the second sleepy inverter is adjacent to the internal buffer, and the internal buffer is adjacent to the fourth non-sleepy inverter.

18. The semiconductor device of claim 11, wherein:
the D flip-flop includes:
  a primary latch that includes a first sleepy inverter and a first non-sleepy inverter, a first subset of the first transistors and the second transistors being configured as the first sleepy inverter and a second subset of the first transistors and the second transistors being configured as the first non-sleepy inverter, the first transistors and the second transistors including delay transistors of the multiplexer; and
  a secondary latch that includes a second sleepy inverter and a second non-sleepy inverter, a first subset of the third transistors and the fourth transistors being configured as the second sleepy inverter and a second subset of the third transistors and the fourth transistors are configured as the second non-sleepy inverter;
the SDFQ further includes:
  a clock buffer that includes a third non-sleepy inverter and a fourth non-sleepy inverter connected in series, a third subset of the first transistors and the second transistors being configured as the third non-sleepy inverter and a third subset of the third transistors and the fourth transistors being configured as the fourth non-sleepy inverter;
the D flip-flop includes:
  an internal buffer coupled between the primary latch and the secondary latch, wherein a fourth subset of the third transistors and the fourth transistors being configured as the internal buffer;
the third non-sleepy inverter is adjacent to the delay transistors, the delay transistors are adjacent to the first sleepy inverter, and the first sleepy inverter is adjacent to the first non-sleepy inverter; and
the fourth non-sleepy inverter is adjacent to the second sleepy inverter, the second sleepy inverter is adjacent to the internal buffer, and the internal buffer is adjacent to the second non-sleepy inverter.

19. A method of forming a semiconductor device, the method comprising:
forming a substrate;
forming active regions in the substrate including doping corresponding areas of the substrate resulting in:
  the active regions extending in a first direction;
  a first subregion of the substrate including first and second ones of the active regions (first and second active regions);
  the first active region having a first conductivity-type dopant;
  the second active region having a second conductivity-type dopant;
  each of the first and second active regions having a first height with respect to a second direction, the second direction being perpendicular to the first direction;
  a second subregion of the substrate including third and fourth ones of the active regions (third and fourth active regions);
  the third active region having the first conductivity-type dopant;
  the fourth active region having the second conductivity-type dopant; and
  each of the third and fourth active regions having a second height with respect to the second direction, the second height being smaller than the first height;
forming source/drain (S/D) regions in the active regions including doping corresponding first areas of the active regions, the S/D regions representing first transistor-components, the forming S/D regions resulting in:
  second areas of the active regions which are between corresponding S/D regions are channel regions representing second transistor-components;
  ones of the channel regions in the first and second active regions having a first channel size; and
  ones of the channel regions in the third and fourth active regions a second channel size, the second channel size being smaller than the first channel size; and forming gate lines over corresponding ones of the channel regions, the gate lines representing third transistor-components; and the forming active regions, the forming S/D regions and the forming gate lines further resulting in transistors which are configured to define a scan insertion D flip flop (SDFQ) that includes a multiplexer serially connected at an internal node to a D flip-flop (FF), a subset of ones of the transistors that define the multiplexer including:
- ones of the transistors having first and second transistor-components which are in the first and second active regions and which represent data transistors for selecting a data input signal; and
- ones of the transistors having first and second transistor-components which are in the third and fourth active regions and which represent scan transistors for selecting a scan input signal.

20. The method of claim 19, wherein the forming active regions further results in:

the first subregion and the second subregion being aligned relative to the first direction and displaced relative to the second direction.

\* \* \* \* \*